(12) United States Patent
Rong et al.

(10) Patent No.: US 8,988,158 B2
(45) Date of Patent: Mar. 24, 2015

(54) HYBRID VOLTAGE CONTROLLED OSCILLATOR

(71) Applicant: QUALCOMM Incorporated, San Diego, CA (US)

(72) Inventors: Sujiang Rong, San Diego, CA (US); Li Liu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 13/836,932

(22) Filed: Mar. 15, 2013

(65) Prior Publication Data

US 2014/0266479 A1    Sep. 18, 2014

(51) Int. Cl.
*H03B 5/12*    (2006.01)
*H03B 5/02*    (2006.01)

(52) U.S. Cl.
CPC ................ *H03B 5/1228* (2013.01); *H03B 5/02* (2013.01); *H03B 5/1296* (2013.01); *H03B 5/1215* (2013.01); *H03B 2200/0082* (2013.01); *H03B 2200/009* (2013.01)
USPC ...................................... 331/117 FE; 331/56

(58) Field of Classification Search
USPC .............................................. 331/117 FE, 56
See application file for complete search history.

(56) References Cited

U.S. PATENT DOCUMENTS

| 8,018,293 | B2 | 9/2011 | Rangarajan et al. |
| 2009/0066431 | A1 | 3/2009 | Shin et al. |
| 2009/0189704 | A1 | 7/2009 | Li |
| 2010/0238843 | A1 | 9/2010 | Taghivand |
| 2010/0271086 | A1 | 10/2010 | Bao et al. |
| 2011/0018644 | A1 | 1/2011 | Yun et al. |
| 2012/0082151 | A1 | 4/2012 | Liu et al. |
| 2012/0286889 | A1 | 11/2012 | Park et al. |

OTHER PUBLICATIONS

Liscindini, et al., "A 36mW/9mW Power-Scalable DCO in 55nm CMOS for GSM/WCDMA Frequency Synthesizers", ISSCC Session 20 RF Frequency Generation 20.4, 2012, 3pgs.
Partial International Search Report—PCT/US2014/023791—ISA/EPO—Jul. 23, 2014.
International Search Report and Written Opinion—PCT/US2014/023791—ISA/EPO—Sep. 30, 2014.

*Primary Examiner* — Joseph Chang
(74) *Attorney, Agent, or Firm* — Arent Fox LLP

(57) ABSTRACT

A method, an apparatus, and a computer program product are provided. The apparatus provides a VCO signal. The apparatus is a VCO. The apparatus includes a first transconductance circuit. The apparatus further includes a second transconductance circuit coupled with the first transconductance circuit. The second transconductance circuit has a first configuration/mode (e.g., CMOS configuration/mode) and a second configuration/mode (e.g., NMOS configuration/mode or PMOS configuration/mode). The second transconductance circuit is configured to couple an input of the second transconductance circuit to the first transconductance circuit in the first configuration/mode. The second transconductance circuit is configured to isolate the input of the second transconductance circuit from the first transconductance circuit in the second configuration/mode. The second transconductance circuit may include a first transistor and a second transistor, and the input may be a gate of each of the first transistor and the second transistor.

94 Claims, 8 Drawing Sheets

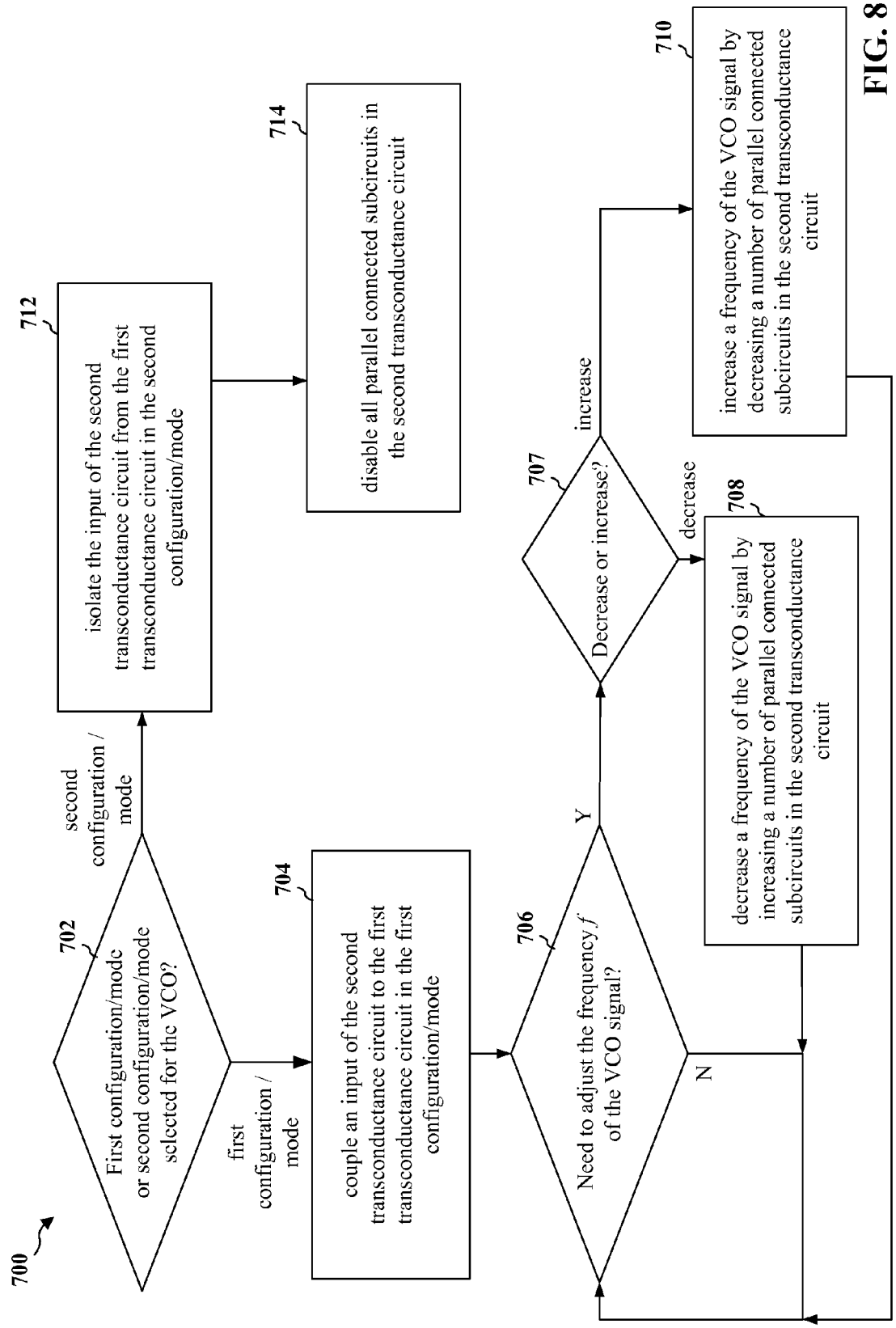

HYBRID VOLTAGE CONTROLLED OSCILLATOR

BACKGROUND

1. Field

The present disclosure relates generally to communication systems, and more particularly, to a hybrid voltage controlled oscillator (VCO).

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

The wireless device may include one or more oscillators to generate one or more oscillator signals at one or more desired frequencies. The oscillator signal(s) may be used to generate the transmit LO signal for the transmitter and the receive LO signal for the receiver. The oscillator(s) may be required to generate the oscillator signal(s) to meet the requirements of the wireless communication system with which the wireless device communicates.

A wireless device may support communication with wireless systems of different radio technologies, which may have different requirements for the transmit LO signal and/or the receive LO signal. The different requirements may require having multiple oscillators with different characteristics (e.g., good phase noise and low power consumption). Having multiple oscillators with different characteristics to support different radio technologies may increase circuit area, circuit complexity, and cost and may also have other disadvantages. As such, there is a need for a single hybrid/multi-mode oscillator that is configurable into different modes/configurations, including a first mode for providing low power consumption and a second mode for providing good phase noise performance. Using a single multi-mode oscillator to support multiple radio technologies with different oscillator requirements may reduce circuit area, circuit complexity, and cost and may also have other advantages.

SUMMARY

In an aspect of the disclosure, a method, a computer program product, and an apparatus are provided. The apparatus may be a VCO for providing a VCO signal. The VCO may include a first transconductance circuit and a second transconductance circuit coupled to the first transconductance circuit. The VCO is configured to couple an input of the second transconductance circuit to the first transconductance circuit in a first configuration. The VCO is configured to isolate the input of the second transconductance circuit from the first transconductance circuit in a second configuration.

BRIEF DESCRIPTION OF THE DRAWINGS

FIG. 8 is a flow chart of a method of providing a VCO signal in a VCO.

DETAILED DESCRIPTION

Figure 1:
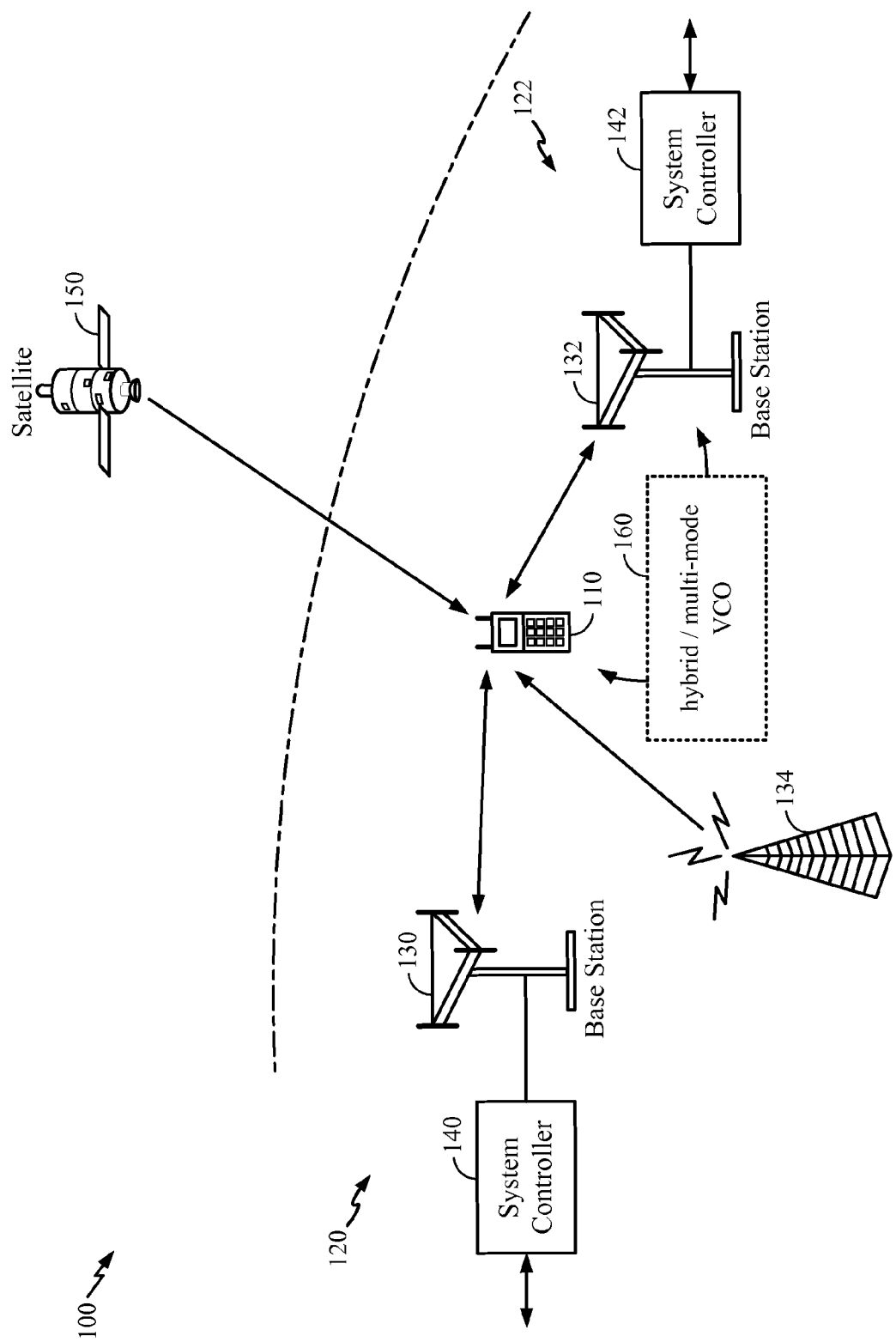
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium.

Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 and/or the base stations 130, 132 may include an exemplary hybrid/multi-mode VCO 160. An exemplary hybrid/multi-mode VCO 160 is provided infra.

Figure 2:
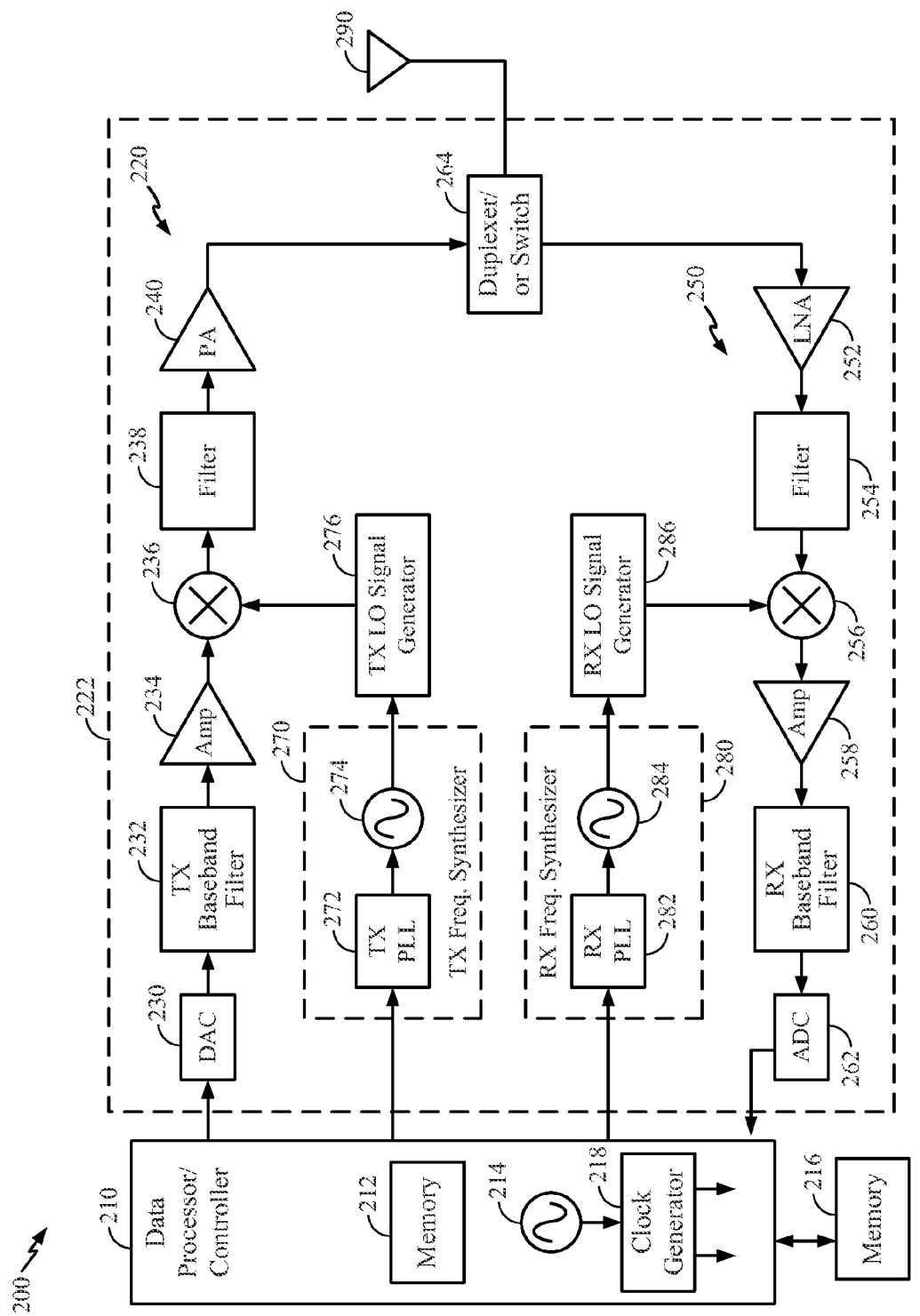
FIG. 2 is a block diagram of a wireless device.

FIG. 2 is a block diagram 200 of an exemplary wireless device, such as the wireless device 110. The wireless device includes a data processor/controller 210, a transceiver 222, and an antenna 290. The data processor/controller 210 may be referred to as a processing system. A processing system may include the data processor/controller 210 or both the data processor/controller 210 and the memory 216. The transceiver 222 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 250 and the receiver 220. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 222 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 218 may receive the VCO signal from the oscillator 214 and may generate clock signals for various modules within the data processor/controller 210. The data processor/controller 210 may be implemented on one or more application specific integrated circuits (ASICs) and/or other ICs.

The wireless device 110 may support communication with wireless systems of different radio technologies, which may have different requirements for the TX LO signal and/or the RX LO signal, and hence different requirements for the VCOs 274, 284. For example, the wireless device 110 may support one or more of GSM, CDMA, WCDMA, and LTE. GSM/CDMA may require a VCO to have a good phase noise performance (e.g., less than −121 dBc/Hz at an offset of 400 kHz). However, power consumption may be less important for GSM and/or CDMA. In contrast, WCDMA/LTE may have less stringent phase noise requirements for an oscillator. However, low power consumption (e.g., 6-7 mA core current from 1.15 V) may be important for WCDMA and/or LTE. The wireless device 110 may include one or more VCOs for GSM/CDMA and one or more VCOs for WCDMA/LTE. The VCOs for GSM and/or CDMA may be designed to have good phase noise performance, whereas the VCOs for WCDMA and/or LTE may be designed to consume low power. Having multiple oscillators with different characteristics (e.g., good phase noise and low power consumption) to support different radio technologies may increase circuit area, circuit complexity, and cost and may also have other disadvantages. As such, there is a need for a single multi-mode (or hybrid) VCO that is configurable into different modes/configurations, including a first mode for providing low power consumption and a second mode for providing good phase noise performance. Accordingly, the VCOs 274, 284 may be hybrid/multi-mode VCOs as provided infra. Using a single multi-mode oscillator to support multiple radio technologies with different oscillator requirements may reduce circuit area, circuit complexity, and cost and may also have other advantages.

Figure 3:
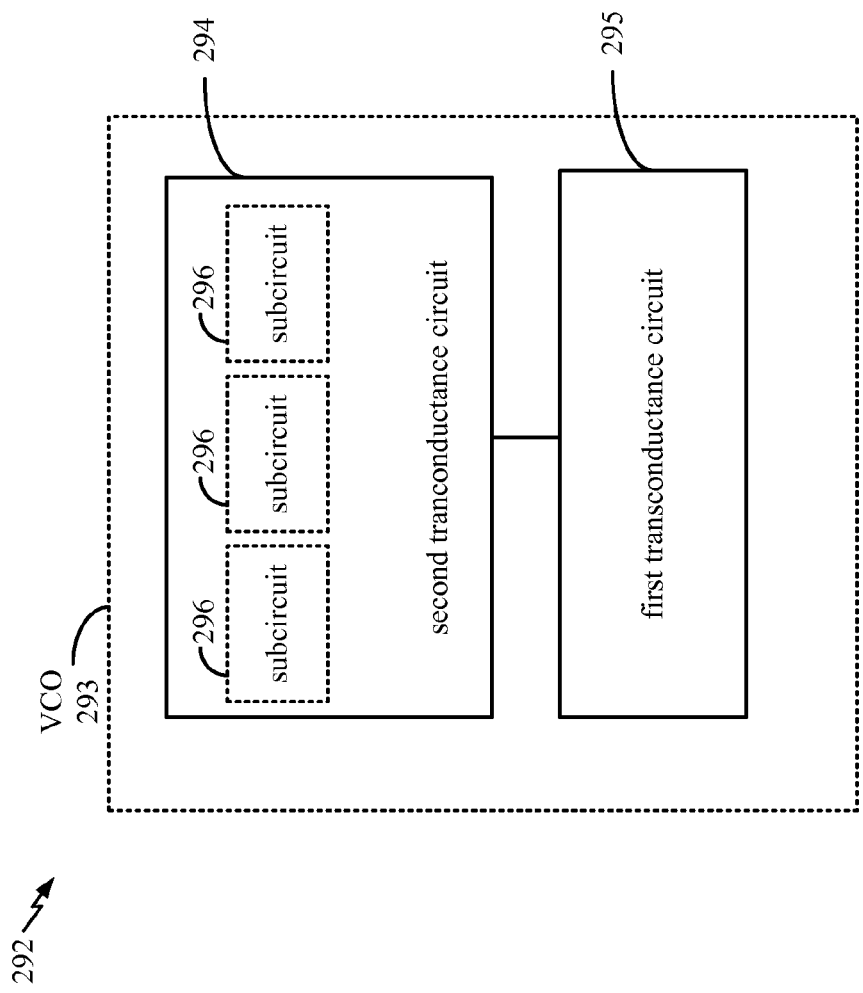
FIG. 3 is a block diagram of a hybrid/multi-mode VCO.

FIG. 3 is a block diagram 292 of a hybrid/multi-mode VCO 293. The multi-mode VCO 293 includes a first transconductance circuit 295 and a second transconductance circuit 294 coupled to the first transconductance circuit 295. The multi-mode VCO 293 couples an input of the second transconductance circuit 294 to the first transconductance circuit 295 in a first configuration/mode. The multi-mode VCO 293 isolates the input of the second transconductance circuit 294 from the first transconductance circuit 295 in a second configuration. The second transconductance circuit 295 may include a plurality of subcircuits 296 that may be connected/disconnected in the first configuration/mode in order to increase or to decrease a transconductance of the second transconductance circuit 295. Adjusting the transconductance of the second transconductance circuit 295 adjusts a VCO frequency of the multi-mode VCO 293.

Figure 4:
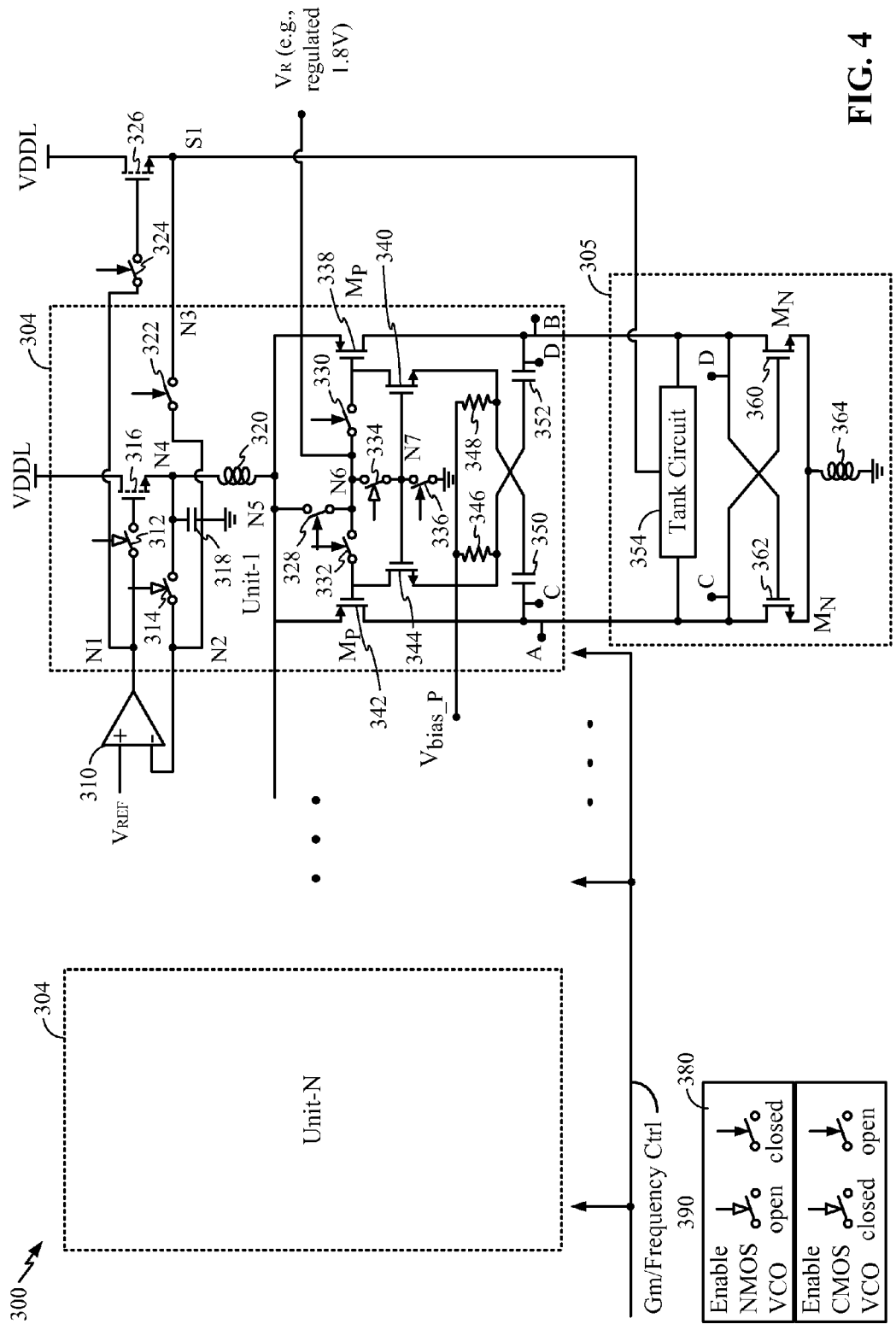
FIG. 4 is a first schematic circuit diagram of a first exemplary multi-mode VCO supporting two modes/configurations.

FIG. 4 is a first schematic circuit diagram 300 of a first exemplary multi-mode VCO supporting two modes/configurations. For example, the multi-mode VCO may be used for each of the VCOs 274, 284 illustrated in FIG. 2. The multi-mode VCO in the diagram 300 includes an n-channel metal-oxide-semiconductor (NMOS) subcircuit 305 and a p-channel metal-oxide-semiconductor (PMOS) subcircuit 304. The NMOS subcircuit 305 includes an NMOS transconductance (Gm) circuit, including NMOS transistors 360, 362. The NMOS transistors 360, 362 are an NMOS differential transistor pair and are shown cross-coupled, with the drain of the NMOS transistor 362 coupled to the gate of the NMOS transistor 360, and the drain of the NMOS transistor 360 coupled to the gate of the NMOS transistor 362. The NMOS transistors 360, 362 may alternatively be cross coupled through a transformer. The NMOS transistors 360, 362 operate as gain transistors for the multi-mode VCO in both an NMOS mode and a CMOS mode. The sources of the NMOS transistors 360, 362 are coupled together and to the inductor 364. The inductor 364 is coupled between the sources of the NMOS transistors 360, 362 and circuit ground. In one configuration, the inductor 364 may be omitted and the sources of the NMOS transistors 360, 362 may be coupled to circuit ground. In another configuration, the inductor 364 may be replaced by an NMOS transistor, where the gate of the NMOS transistor is biased by a current mirror, the drain of the NMOS transistor is coupled to the sources of the NMOS transistors 360, 362, and the source of the NMOS transistor is coupled to circuit ground. A tank circuit 354 is coupled between the drains of the NMOS transistors 360, 362. The tank circuit may include an inductor and variable capacitor (see FIG. 7A), where the inductor has a center tap coupled to a supply node S1. The variable capacitor may include a configurable capacitor bank and/or one or more varactors. The tank circuit may alternatively include a transformer (see FIG. 7B), where the transformer has center taps coupled to the supply node S1 and a bias voltage $V_{bias\_N}$.

The PMOS subcircuit 304 includes a PMOS transconductance (Gm) circuit, including PMOS transistors 338, 342. The PMOS transistors 338, 342 are a PMOS differential transistor pair and are shown cross-coupled, with the drain of the PMOS transistor 338 coupled to the gate of the PMOS transistor 342, and the drain of the PMOS transistor 342 coupled to the gate of the PMOS transistor 338. The PMOS transistors 338, 342 may alternatively be cross coupled through a transformer. The PMOS transistors 338, 342 operate as gain transistors for the multi-mode VCO in a CMOS mode only. The sources of the PMOS transistors 338, 342 are coupled together at a node N5 and to the inductor 320. A capacitor 350 and an NMOS transistor 340 are coupled in series between the drain of the PMOS transistor 342 and the gate of the PMOS transistor 338. In one configuration, the capacitor 350 may be omitted. A resistor 348 is coupled to a node between the capacitor 350 and the NMOS transistor 340 and to bias voltage $V_{bias\_P}$. In one configuration, the resistor 348 may be omitted. A capacitor 352 and an NMOS transistor 344 are coupled in series between the drain of the PMOS transistor 338 and the gate of the PMOS transistor 342. In one configuration, the capacitor 352 may be omitted. A resistor 346 is coupled to a node between the capacitor 352 and the NMOS transistor 344 and to bias voltage $V_{bias\_P}$. In one configuration, the resistor 346 may be omitted.

The inductor 320 is coupled between a node N4 and the node N5. A capacitor 318 is coupled between the node N4 and circuit ground. A switch 314 is coupled between a node N2 and the node N4. The switch 314 is open in an NMOS mode and closed in a CMOS mode (see the legend 380). The node N4 is also coupled to a source of an NMOS transistor 316. A drain of the NMOS transistor 316 is coupled to a supply voltage VDDL. A switch 312 is coupled between a gate of the NMOS transistor 316 and a node N1. The switch 312 is open in an NMOS mode and closed in a CMOS mode. A switch 322 is coupled between the node N2 and a node N3. The switch 322 is open in a CMOS mode and closed in an NMOS mode.

The PMOS subcircuit 304 may be a separate unit. A plurality of such separate PMOS units, unit-1, unit-2, . . . , unit-N may be coupled in parallel and coupled to the NMOS subcircuit 305 through coupling the drains of the PMOS transistors 338, 342 to the drains of the NMOS transistors 360, 362. The coupling of the PMOS units may be performed to control a transconductance (Gm) and a frequency (390) of the VCO signal. External to the PMOS subcircuit 304 (and to the PMOS units), an operational amplifier (op-amp) 310 has a non-inverting input coupled to a voltage $V_{REF}$, an inverting input coupled to the node N2, and an output coupled to the node N1. The node N3 is coupled to the supply node S1. The node N1 is coupled to a switch 324. The switch 324 is coupled between the node N1 and a gate of an NMOS transistor 326. The switch 324 is open in a CMOS mode and closed in an NMOS mode. A source of the NMOS transistor 326 is coupled to the supply node S1, and a drain of the NMOS transistor 326 is coupled to the supply voltage VDDL. In the CMOS mode, the supply voltage VDDL is supplied to the node N5, and in the NMOS mode, the supply voltage VDDL is supplied to the supply node S1.

A switch 328 is coupled between the node N5 and a node N6. The switch 328 is open in a CMOS mode and closed in an NMOS mode. A switch 332 is coupled between a gate of the PMOS transistor 342 and the node N6. The switch 332 is open in a CMOS mode and closed in an NMOS mode. A switch 330 is coupled between a gate of the PMOS transistor 338 and the node N6. The switch 330 is open in a CMOS mode and closed in an NMOS mode. A switch 334 is coupled between the node N6 and a node N7. The switch 334 is open in an NMOS mode and closed in a CMOS mode. The gates of the NMOS transistors 340, 344 are coupled together to the node N7. A switch 336 is coupled between the node N7 and circuit ground. The switch 336 is open in a CMOS mode and closed in an NMOS mode. The node N6 is connected to a supply voltage $V_R$ (e.g., 1.8 V).

In an NMOS mode, the switches 328, 330, 332 are closed and operate to turn off the PMOS transistors 338, 342 by connecting together the gate and the source of the PMOS transistor 342 and the gate and the source of the PMOS transistor 338, and biasing the gates of the PMOS transistors 338, 342 to the supply voltage $V_R$. The switches 334, 336 operate to couple the gates of the NMOS transistors 340, 344 to circuit ground in an NMOS mode and to the supply voltage $V_R$ in a CMOS mode. Accordingly, the NMOS transistors 340, 344 operate as switches to couple an input of the PMOS transistors 338, 342 to the NMOS transistors 360, 362 in a CMOS mode, and to isolate the input of the PMOS transistors 338, 342 from the NMOS transistors 360, 362 in an NMOS mode. Specifically, the NMOS transistors 340, 344 couple the gates of the PMOS transistors 338, 342 to the NMOS transistors 360, 362 in a CMOS mode, and isolate the gates of the PMOS transistors 338, 342 from the NMOS transistors 360, 362 in an NMOS mode. One or both of the NMOS transistors 340, 344 may be PMOS transistors. Assuming both of the transistors 340, 344 are PMOS transistors, the switch 334 would be open in a CMOS mode and closed in an NMOS mode, and the switch 336 would be open in an NMOS mode and closed in a CMOS mode.

In an NMOS mode, the switches 312, 314, 334 are open, and the switches 322, 324, 328, 330, 332, 336 are closed. In the NMOS mode, the PMOS transistors 338, 342 are turned off and the gates of the PMOS transistors 338, 342 are isolated from the NMOS transistors 360, 362 by the NMOS transistors 340, 344, which are turned off. The NMOS mode, which has a good VCO noise performance, may be used for GSM/CDMA wireless technologies. In a CMOS mode, the switches 312, 314, 334 are closed, and the switches 322, 324, 328, 330, 332, 336 are open. In the CMOS mode, the gates of the PMOS transistors 338, 342 are coupled to the NMOS transistors 360, 362 by the NMOS transistors 340, 344, which are turned on. The CMOS mode, which has a lower power consumption, may be used for WCDMA/LTE wireless technologies. The CMOS and NMOS modes may be configured based on other criteria other than the wireless technology. For example, the NMOS mode may be selected for higher modulation order (e.g., 16 quadrature amplitude modulation (QAM) (16-QAM) or higher) and the CMOS mode may be selected for a lower modulation order (e.g., binary phase-shift keying (BPSK) or quadrature phase-shift keying (QPSK)). For another example, the NMOS mode may be selected for a high received signal quality, and the CMOS mode made be selected for a low received signal quality.

In the CMOS mode, an output frequency of the multi-mode VCO may be adjusted by connecting/disconnecting additional PMOS units in parallel. That is, an output frequency of the multi-mode VCO may be increased by disconnecting some parallel PMOS units or by decreasing a number of parallel connected PMOS units, and may be decreased by connecting some PMOS units or by increasing a number of parallel connected PMOS units. Increasing the number of parallel connected PMOS units, increases a transconductance (Gm) of the set of PMOS units, which decreases the output frequency of the multi-mode VCO and helps the VCO start up at a lower operational frequency when the tank impedance is lower. Decreasing the number of parallel connected PMOS units, decreases a transconductance (Gm) of the set of PMOS units, which increases the output frequency of the multi-mode VCO and may not hurt the VCO's start-up condition as the tank impedance is higher at a higher frequency. Accordingly, the output frequency of the multi-mode VCO may be adjusted between a high frequency $f_H$ with one connected PMOS unit and a low frequency $f_L$ with N parallel connected PMOS units.

Figure 5:
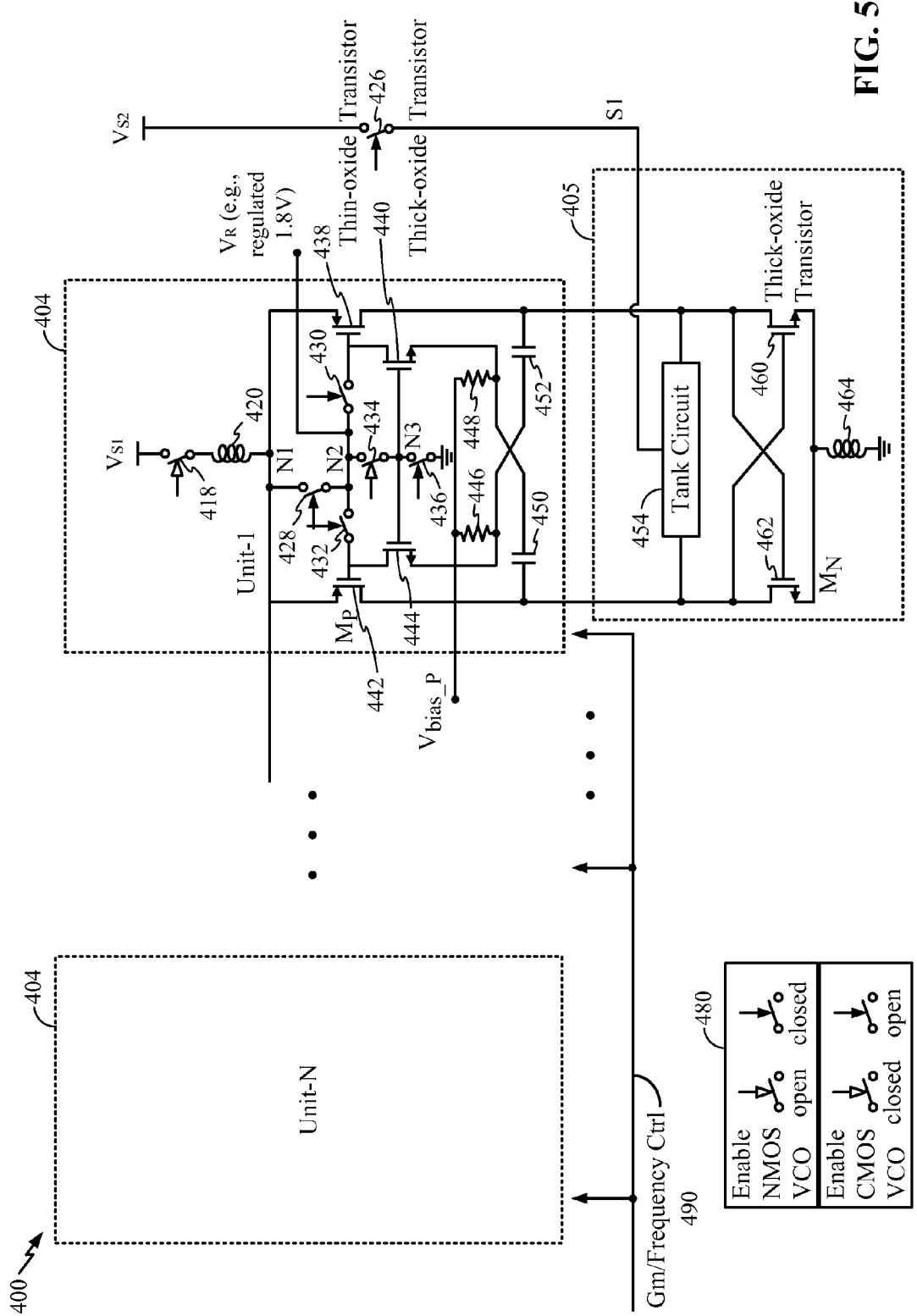
FIG. 5 is a second schematic circuit diagram of the first exemplary multi-mode VCO supporting two modes/configurations.

FIG. 5 is a second schematic circuit diagram 400 of the first exemplary multi-mode VCO supporting two modes/configurations. The multi-mode VCO in the diagram 400 includes an NMOS subcircuit 405 and a PMOS subcircuit 404. The NMOS subcircuit 405 includes an NMOS transconductance (Gm) circuit, including NMOS transistors 460, 462. The NMOS transistors 460, 462 are an NMOS differential transistor pair and are shown cross-coupled, with the drain of the NMOS transistor 462 coupled to the gate of the NMOS transistor 460, and the drain of the NMOS transistor 460 coupled to the gate of the NMOS transistor 462. The NMOS transistors 460, 462 may alternatively be cross coupled through a transformer. The NMOS transistors 460, 462 operate as gain transistors for the multi-mode VCO in both an NMOS mode and a CMOS mode. The sources of the NMOS transistors 460, 462 are coupled together and to the inductor 464. The inductor 464 is coupled between the sources of the NMOS transistors 460, 462 and circuit ground. As discussed supra, in one configuration, the inductor 464 may be omitted and the sources of the NMOS transistors 460, 462 may be coupled to circuit ground. In another configuration, the inductor 464 may be replaced by an NMOS transistor, where the gate of the NMOS transistor is biased by a current mirror, the drain of the NMOS transistor is coupled to the sources of the NMOS transistors 460, 462, and the source of the NMOS transistor is coupled to circuit ground. A tank circuit 454 is coupled between the drains of the NMOS transistors 460, 462. The tank circuit may include an inductor and variable capacitor, where the inductor has a center tap coupled to a supply node S1. The variable capacitor may include a capacitor bank and/or varactors. The tank circuit may alternatively include a transformer.

The PMOS subcircuit 404 includes a PMOS transconductance (Gm) circuit, including PMOS transistors 438, 442. The PMOS transistors 438, 442 are a PMOS differential transistor pair and are shown cross-coupled, with the drain of the PMOS transistor 438 coupled to the gate of the PMOS transistor 442, and the drain of the PMOS transistor 442 coupled to the gate of the PMOS transistor 438. The PMOS transistors 438, 442 may alternatively be cross coupled through a transformer. The PMOS transistors 438, 442 operate as gain transistors for the multi-mode VCO in a CMOS mode only. The sources of the PMOS transistors 438, 442 are coupled together at a node N1 and to the inductor 420. A capacitor 450 and an NMOS transistor 440 are coupled in series between the drain of the PMOS transistor 442 and the gate of the PMOS transistor 438. In one configuration, the capacitor 450 may be omitted. A resistor 448 is coupled to a node between the capacitor 450 and the NMOS transistor 440 and to bias voltage $V_{bias\_P}$. In one configuration, the resistor 448 may be omitted. A capacitor 452 and an NMOS transistor 444 are coupled in series between the drain of the PMOS transistor 438 and the gate of the PMOS transistor 442. In one configuration, the capacitor 452 may be omitted. A resistor 446 is coupled to a node between the capacitor 452 and the NMOS transistor 444 and to bias voltage $V_{bias\_P}$. In one configuration, the resistor 446 may be omitted. In one configuration, the oxide layer thickness of the NMOS transistors 460, 462 is greater than an oxide layer thickness of the PMOS transistors 438, 442. Assuming the NMOS and PMOS transistors have two possible thicknesses, $t_{thin}$ and $t_{thick}$, wherein $t_{thin} < t_{thick}$, the PMOS transistors 438, 442 may have an oxide thickness of $t_{thin}$, and the NMOS transistors 460, 462 may have an oxide thickness of $t_{thick}$. The NMOS transistors 440, 444 may also have an oxide thickness of $t_{thick}$.

The inductor 420 is coupled in series with the switch 418 between a first supply voltage $V_{S1}$ and the node N1. The switch 418 is open in an NMOS mode and closed in a CMOS mode (see the legend 480). The PMOS subcircuit 404 may be a separate unit. A plurality of such separate PMOS units, unit-1, unit-2, ..., unit-N may be coupled in parallel and coupled to the NMOS subcircuit 405 through coupling the drains of the PMOS transistors 438, 442 to the drains of the NMOS transistors 460, 462. The coupling of the PMOS units may be performed to control a transconductance (Gm) and a frequency (490) of the VCO signal. External to the PMOS subcircuit 404 (and to the PMOS units), a switch 426 is coupled between a second supply voltage $V_{S2}$ and the supply node S1. The switch 426 is open in a CMOS mode and closed in an NMOS mode. In the CMOS mode, the first supply voltage $V_{S1}$ is supplied to the node N1, and in the NMOS mode, the second supply voltage $V_{S2}$ is supplied to the supply node S1.

A switch 428 is coupled between the node N1 and a node N2. The switch 428 is open in a CMOS mode and closed in an NMOS mode. A switch 432 is coupled between a gate of the PMOS transistor 442 and the node N2. The switch 432 is open in a CMOS mode and closed in an NMOS mode. A switch 430 is coupled between a gate of the PMOS transistor 438 and the node N2. The switch 430 is open in a CMOS mode and closed in an NMOS mode. A switch 434 is coupled between the node N2 and a node N3. The switch 434 is open in an NMOS mode and closed in a CMOS mode. The gates of the NMOS transistors 440, 444 are coupled together to the node N3. A switch 436 is coupled between the node N3 and circuit ground. The switch 436 is open in a CMOS mode and closed in an NMOS mode. The node N2 is connected to a supply voltage $V_R$ (e.g., 1.8 V).

In an NMOS mode, the switches 428, 430, 432 are closed and operate to turn off the PMOS transistors 438, 442 by connecting together the gate and the source of the PMOS transistor 442 and the gate and the source of the PMOS transistor 438, and biasing the gates of the PMOS transistors 438, 442 to the supply voltage $V_R$. The switches 434, 436 operate to couple the gates of the NMOS transistors 440, 444 to circuit ground in an NMOS mode and to the supply voltage $V_R$ in a CMOS mode. Accordingly, the NMOS transistors 440, 444 operate as switches to couple an input of the PMOS transistors 438, 442 to the NMOS transistors 460, 462 in a CMOS mode, and to isolate the input of the PMOS transistors 438, 442 from the NMOS transistors 460, 462 in an NMOS mode. Specifically, the NMOS transistors 440, 444 couple the gates of the PMOS transistors 438, 442 to the NMOS transistors 460, 462 in a CMOS mode, and isolate the gates of the PMOS transistors 438, 442 from the NMOS transistors 460, 462 in an NMOS mode. One or both of the NMOS transistors 440, 444 may be PMOS transistors. Assuming both of the transistors 440, 444 are PMOS transistors, the switch 434 would be open in a CMOS mode and closed in an NMOS mode, and the switch 436 would be open in an NMOS mode and closed in a CMOS mode.

In an NMOS mode, the switches 418, 434 are open, and the switches 426, 428, 430, 432, 436 are closed. In the NMOS mode, the PMOS transistors 438, 442 are turned off and the gates of the PMOS transistors 438, 442 are isolated from the NMOS transistors 460, 462 by the NMOS transistors 440, 444, which are turned off. The NMOS mode, which has a good VCO noise performance, may be used for GSM/CDMA wireless technologies. In a CMOS mode, the switches 418, 434 are closed, and the switches 426, 428, 430, 432, 436 are open. In the CMOS mode, the gates of the PMOS transistors 438, 442 are coupled to the NMOS transistors 460, 462 by the NMOS transistors 440, 444, which are turned on. The CMOS mode, which has a lower power consumption, may be used for WCDMA/LTE wireless technologies. The CMOS and NMOS modes may be configured based on other criteria other than the wireless technology. For example, the NMOS mode may be selected for higher modulation order (e.g., 16-QAM or higher) and the CMOS mode may be selected for a lower modulation order (e.g., BPSK or QPSK). For another example, the NMOS mode may be selected for a high received signal quality, and the CMOS mode made be selected for a low received signal quality.

In the CMOS mode, an output frequency of the multi-mode VCO may be adjusted by connecting/disconnecting additional PMOS units in parallel. That is, an output frequency of the multi-mode VCO may be increased by disconnecting some parallel PMOS units or by decreasing a number of parallel connected PMOS units, and may be decreased by connecting some PMOS units or by increasing a number of parallel connected PMOS units. Increasing the number of parallel connected PMOS units, increases a transconductance (Gm) of the set of PMOS units, which decreases the output frequency of the multi-mode VCO and helps the VCO start up at a lower operational frequency when the tank impedance is lower. Decreasing the number of parallel connected PMOS units, decreases a transconductance (Gm) of the set of PMOS units, which increases the output frequency of the multi-mode VCO and may not hurt the VCO's start-up condition as the tank impedance is higher at a higher frequency. Accordingly, the output frequency of the multi-mode VCO may be adjusted between a high frequency $f_H$ with one connected PMOS unit and a low frequency $f_L$ with N parallel connected PMOS units.

Figure 6:
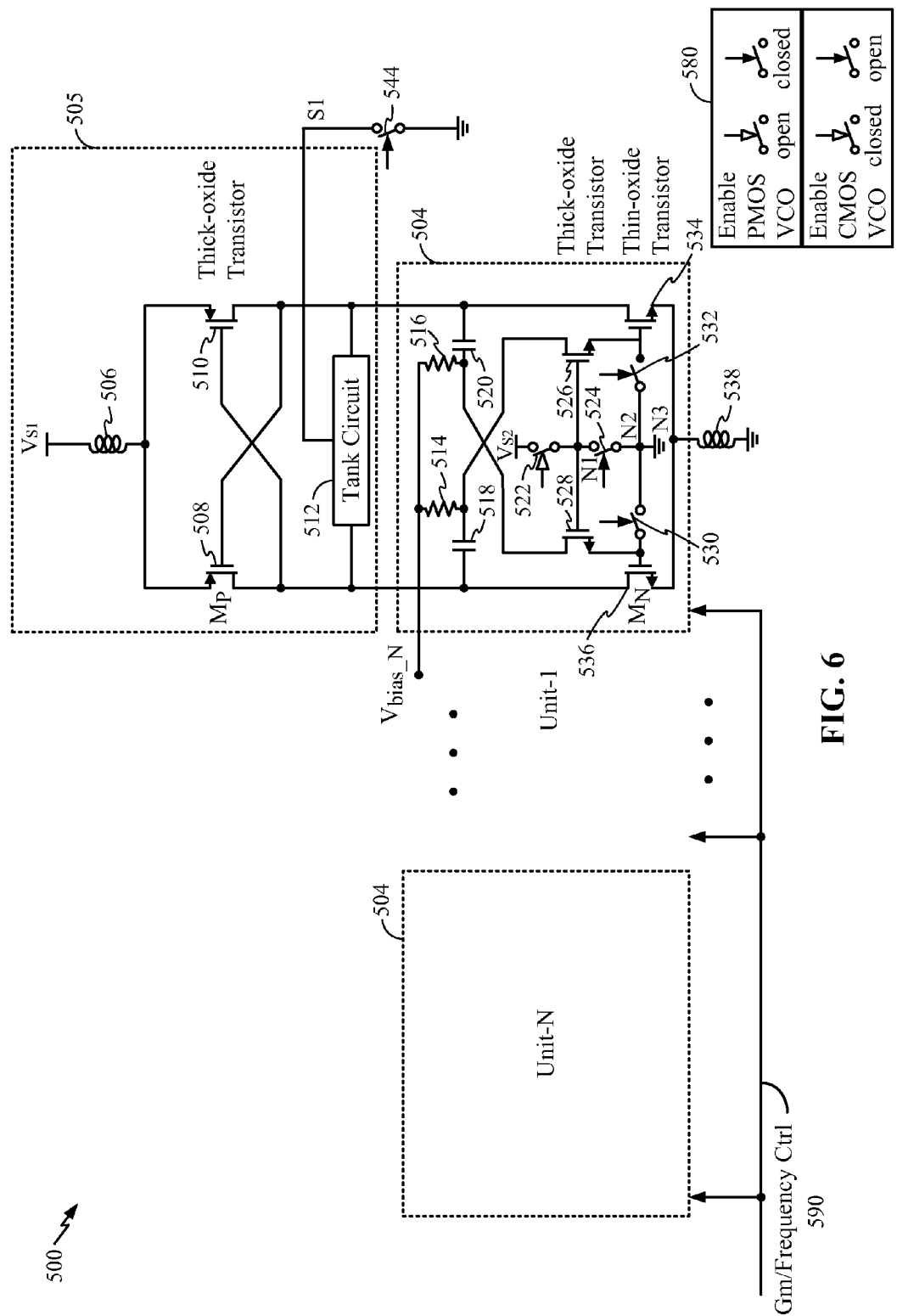
FIG. 6 is a schematic circuit diagram of a second exemplary multi-mode VCO supporting two modes/configurations.

FIG. 6 is a schematic circuit diagram 500 of a second exemplary multi-mode VCO supporting two modes/configurations. The multi-mode VCO in the diagram 500 includes a PMOS subcircuit 505 and an NMOS subcircuit 504. The PMOS subcircuit 505 includes a PMOS transconductance (Gm) circuit, including PMOS transistors 508, 510. The PMOS transistors 508, 510 are a PMOS differential transistor pair and are shown cross-coupled, with the drain of the PMOS transistor 508 coupled to the gate of the PMOS transistor 510, and the drain of the PMOS transistor 510 coupled to the gate of the PMOS transistor 508. The PMOS transistors 508, 510 may alternatively be cross coupled through a transformer. The PMOS transistors 508, 510 operate as gain transistors for the multi-mode VCO in both a PMOS mode and a CMOS mode. The sources of the PMOS transistors 508, 510 are coupled together and to the inductor 506. The inductor 506 is coupled between the sources of the PMOS transistors 508, 510 and a first voltage supply $V_{S1}$. A tank circuit 512 is coupled between the drains of the PMOS transistors 508, 510. The tank circuit may include an inductor and variable capacitor, where the inductor has a center tap coupled to a supply node S1. The variable capacitor may include a capacitor bank and/or varactors. As discussed supra, the tank circuit may alternatively include a transformer.

The NMOS subcircuit 504 includes an NMOS transconductance (Gm) circuit, including NMOS transistors 534, 536. The NMOS transistors 534, 536 are an NMOS differential transistor pair and are shown cross-coupled, with the drain of the NMOS transistor 534 coupled to the gate of the NMOS transistor 536, and the drain of the NMOS transistor 536 coupled to the gate of the NMOS transistor 534. The NMOS transistors 534, 536 may alternatively be cross coupled through a transformer. The NMOS transistors 534, 536 operate as gain transistors for the multi-mode VCO in a CMOS mode only. The sources of the NMOS transistors 534, 536 are coupled together at a node N3. A capacitor 520 and an NMOS transistor 528 are coupled in series between the drain of the NMOS transistor 534 and the gate of the NMOS transistor 536. In one configuration, the capacitor 520 may be omitted. A resistor 516 is coupled to a node between the capacitor 520 and the NMOS transistor 528 and to bias voltage $V_{bias\_N}$. In one configuration, the resistor 516 may be omitted. A capacitor 518 and an NMOS transistor 526 are coupled in series between the drain of the NMOS transistor 536 and the gate of the NMOS transistor 534. In one configuration, the capacitor 518 may be omitted. A resistor 514 is coupled to a node between the capacitor 518 and the NMOS transistor 526 and to bias voltage $V_{bias\_N}$. In one configuration, the resistor 514 may be omitted. In one configuration, the oxide layer thickness of the PMOS transistors 508, 510 is greater than an oxide layer thickness of the NMOS transistors 534, 536. Assuming the NMOS and PMOS transistors have two possible thicknesses, $t_{thin}$ and $t_{thick}$, wherein $t_{thin} < t_{thick}$, the NMOS transistors 534, 536 may have an oxide thickness of $t_{thin}$, and the PMOS transistors 508, 510 may have an oxide thickness of $t_{thick}$. The NMOS transistors 526, 528 may also have an oxide thickness of $t_{thick}$.

The NMOS subcircuit 504 may be a separate unit. A plurality of such separate NMOS units, unit-1, unit-2, . . . , unit-N may be coupled in parallel and coupled to the PMOS subcircuit 505 through coupling the drains of the NMOS transistors 534, 536 to the drains of the PMOS transistors 508, 510. The coupling of the NMOS units may be performed to control a transconductance (Gm) and a frequency (590) of the VCO signal. External to the NMOS subcircuit 504 (and to the NMOS units), an inductor 538 is coupled between the node N3 and circuit ground. In addition, a switch 544 is coupled between the supply node S1 and circuit ground. The switch 544 is open in a CMOS mode and closed in a PMOS mode (see the legend 580).

A switch 524 is coupled between a node N1 and a node N2. The switch 524 is open in a CMOS mode and closed in a PMOS mode. A switch 530 is coupled between a gate of the NMOS transistor 536 and the node N2. The switch 530 is open in a CMOS mode and closed in a PMOS mode. A switch 532 is coupled between a gate of the NMOS transistor 534 and the node N2. The switch 532 is open in a CMOS mode and closed in a PMOS mode. A switch 522 is coupled between the node N1 and a second supply voltage $V_{S2}$. The switch 522 is open in a PMOS mode and closed in a CMOS mode. The gates of the NMOS transistors 526, 528 are coupled together to the node N1. The node N2 is connected to circuit ground.

In the CMOS mode, the second supply voltage $V_{S2}$ is supplied to the node N1, and in the PMOS mode, circuit ground is connected to the node N1 and to the supply node S1. In a PMOS mode, the switches 524, 530, 532 are closed and operate to turn off the NMOS transistors 526, 528, 534, 536. The switches 522, 524 operate to couple the gates of the NMOS transistors 526, 528 to circuit ground in a PMOS mode and to the second supply voltage $V_{S2}$ in a CMOS mode. Accordingly, the NMOS transistors 526, 528 operate as switches to couple an input of the NMOS transistors 534, 536 to the PMOS transistors 508, 510 in a CMOS mode, and to isolate the input of the NMOS transistors 534, 536 from the PMOS transistors 508, 510 in a PMOS mode. Specifically, the NMOS transistors 526, 528 couple the gates of the NMOS transistors 534, 536 to the PMOS transistors 508, 510 in a CMOS mode, and isolate the gates of the NMOS transistors 534, 536 from the PMOS transistors 508, 510 in a PMOS mode. One or both of the NMOS transistors 526, 528 may be PMOS transistors. Assuming both of the transistors 526, 528 are PMOS transistors, the switch 522 would be open in a CMOS mode and closed in a PMOS mode, and the switch 524 would be open in a PMOS mode and closed in a CMOS mode.

In a PMOS mode, the switch 522 is open, and the switches 544, 524, 530, 532 are closed. In the PMOS mode, the NMOS transistors 534, 536 are turned off and the gates of the NMOS transistors 534, 536 are isolated from the PMOS transistors 508, 510 by the NMOS transistors 526, 528, which are turned off. The PMOS mode may have a lower flicker noise (also referred to as 1/f noise or pink noise) than the CMOS mode. In a CMOS mode, the switch 522 is closed, and the switches 544, 524, 530, 532 are open. In the CMOS mode, the gates of the NMOS transistors 534, 536 are coupled to the PMOS transistors 508, 510 by the NMOS transistors 526, 528, which are turned on. The CMOS mode has a lower power consumption than the PMOS mode.

In the CMOS mode, an output frequency of the multi-mode VCO may be adjusted by connecting/disconnecting additional NMOS units in parallel. That is, an output frequency of the multi-mode VCO may be increased by disconnecting some parallel NMOS units or by decreasing a number of parallel connected NMOS units, and may be decreased by connecting some NMOS units or by increasing a number of parallel connected NMOS units. Increasing the number of parallel connected NMOS units, increases a transconductance (Gm) of the set of NMOS units, which decreases the output frequency of the multi-mode VCO and helps the VCO start up at a lower operational frequency when the tank impedance is lower. Decreasing the number of parallel connected NMOS units, decreases a transconductance (Gm) of the set of NMOS units, which increases the output frequency of the multi-mode VCO and may not hurt the VCO's start-up condition as the tank impedance is higher at a higher frequency. Accordingly, the output frequency of the multi-mode VCO may be adjusted between a high frequency $f_H$ with one connected PMOS unit and a low frequency $f_L$ with N parallel connected PMOS units.

Figure 7A:
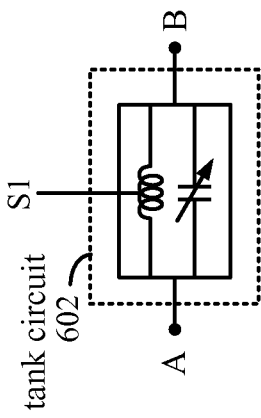
FIG. 7A and FIG. 7B are diagrams of examples of tank circuits.
Figure 7B:
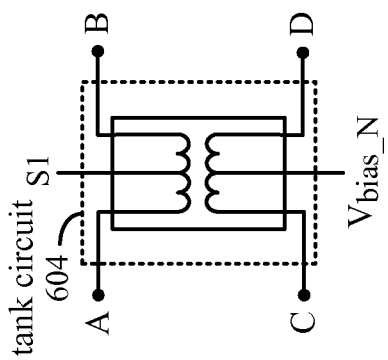

FIG. 7A and FIG. 7B are diagrams 600 of examples of tank circuits. As shown in FIG. 7A, the tank circuit 602 may include an inductor and variable capacitor, where the inductor has a center tap coupled to a supply node S1. The variable capacitor may include a configurable capacitor bank and/or one or more varactors. The tank circuit 602 includes nodes A and B. The nodes A and B are connected to the nodes A and B, respectively, in FIG. 4. As shown in FIG. 7B, the tank circuit 604 may alternatively include a transformer, where the transformer has center taps coupled to the supply node S1 and a bias voltage $V_{bias\_N}$. The tank circuit 604 includes nodes A, B, C, and D. The nodes A, B, C, and D are connected to nodes A, B, C, and D, respectively, in FIG. 4. However, in such a configuration, the node C at the gate of the transistor 360 and at a terminal of the capacitor 350 is disconnected from the node A at the drains of the transistors 342, 362, and the node D at the gate of the transistor 362 and at a terminal of the capacitor 352 is disconnected from the node B at the drains of the transistors 338, 360.

FIG. 8 is a flow chart 700 of a method of providing a VCO signal in a VCO. The method may be performed by an apparatus, such as the VCO and/or a processor/controller configured to control the VCO. The VCO includes a first transconductance circuit and a second transconductance circuit coupled to the first transconductance circuit. For example, referring to FIG. 4, the first transconductance circuit may be the NMOS subcircuit 305, and the second transconductance circuit may be the PMOS subcircuit 304. For another example, referring to FIG. 5, the first transconductance circuit may be the NMOS subcircuit 405, and the second transconductance circuit may be the PMOS subcircuit 404. For yet another example, referring to FIG. 6, the first transconductance circuit may be the PMOS subcircuit 505, and the second transconductance circuit may be the NMOS subcircuit 504. As shown in FIG. 8, in step 702, the apparatus determines whether to select a first configuration/mode or a second configuration/mode. The apparatus may select one of the modes based on the wireless technology, modulation order, signal quality, flicker noise requirements, phase noise requirements, power consumption requirements, or some other factor that may be influenced by a particular configuration/mode of the VCO. If the apparatus selects the first configuration/mode, in step 704, the apparatus couples an input of the second transconductance circuit to the first transconductance circuit. For example, referring to FIG. 4, if the apparatus selects the first configuration/mode, which is the CMOS mode, the apparatus closes the switches 312, 314, 334 and opens the switches 322, 324, 328, 330, 332, 336. For another example, referring to FIG. 5, if the apparatus selects the first configuration/mode, which is the CMOS mode, the apparatus closes the switches 418, 434 and opens the switches 426, 428, 430, 432, 436. For yet another example, referring to FIG. 6, if the apparatus selects the first configuration/mode, which is the CMOS mode, the apparatus closes the switch 522 and opens the switches 544, 524, 530, 532.

In step 706, while in the first configuration/mode, the apparatus determines whether to adjust the frequency f of the VCO signal of the VCO. If the apparatus determines to adjust the frequency of the VCO signal of the VCO, in step 707, the apparatus determines whether to increase or to decrease the frequency of the VCO signal. If the apparatus determines to decrease the frequency of the VCO signal, in step 708, the apparatus decreases a frequency of the VCO signal by increasing a number of parallel connected subcircuits in the second transconductance circuit. If the apparatus determines to increase the frequency of the VCO signal, in step 710, the apparatus increases a frequency of the VCO signal by decreasing a number of parallel connected subcircuits in the second transconductance circuit. After completing steps 708, 710, the step returns to step 706. If the apparatus determines not to adjust the frequency of the VCO signal, the step returns to step 706. For example, referring to FIG. 4, the apparatus decreases a frequency of the VCO signal while in a CMOS mode by increasing a number of the PMOS subcircuit units connected in parallel in the second transconductance circuit 304, and increases a frequency of the VCO signal by decreasing a number of the PMOS subcircuit units connected in parallel in the second transconductance circuit 304. For another example, referring to FIG. 5, the apparatus decreases a frequency of the VCO signal while in a CMOS mode by increasing a number of the PMOS subcircuit units connected in parallel in the second transconductance circuit 404, and increases a frequency of the VCO signal by decreasing a number of the PMOS subcircuit units connected in parallel in the second transconductance circuit 404. For yet another example, referring to FIG. 6, the apparatus decreases a frequency of the VCO signal while in a CMOS mode by increasing a number of the NMOS subcircuit units connected in parallel in the second transconductance circuit 504, and increases a frequency of the VCO signal by decreasing a number of the NMOS subcircuit units connected in parallel in the second transconductance circuit 504.

If the apparatus selects the second configuration/mode, in step 712, the apparatus isolates the input of the second transconductance circuit from the first transconductance circuit. For example, referring to FIG. 4, if the apparatus selects the second configuration/mode, which is the NMOS mode, the apparatus opens the switches 312, 314, 334 and closes the switches 322, 324, 328, 330, 332, 336. For another example, referring to FIG. 5, if the apparatus selects the second configuration/mode, which is the NMOS mode, the apparatus opens the switches 418, 434 and closes the switches 426, 428, 430, 432, 436. For yet another example, referring to FIG. 6, if the apparatus selects the second configuration/mode, which is the PMOS mode, the apparatus opens the switch 522 and closes the switches 544, 524, 530, 532.

When in the second configuration/mode, in step 714, the apparatus disconnects all parallel connected subcircuits. For example, referring to FIG. 4, the apparatus may disconnect all the PMOS subcircuits 304. For another example, referring to FIG. 5, when in the second configuration/mode, which is an NMOS mode, the apparatus may disconnect all PMOS subcircuits 404. For yet another example, referring to FIG. 6, when in the second configuration/mode, which is a PMOS mode, the apparatus may disconnect all the NMOS subcircuits 504.

The second transconductance circuit may include a first transistor and a second transistor, and the input may include a gate of each of the first transistor and the second transistor. For example, referring to FIG. 4, the second transconductance circuit 304 may include the PMOS transistors 338, 342, and the input may be a gate of each of the PMOS transistors 338, 342. For another example, referring to FIG. 5, the second transconductance circuit 404 may include the PMOS transistors 438, 442, and the input may be a gate of each of the PMOS transistors 438, 442. For yet another example, referring to FIG. 6, the second transconductance circuit 504 may include the NMOS transistors 534, 536, and the input may be a gate of each of the NMOS transistors 534, 536.

The first transconductance circuit may include a first differential transistor pair and the second transconductance circuit may include a second differential transistor pair. For example, referring to FIG. 4, the first transconductance circuit may include the first differential transistor pair of NMOS transistors 360, 362, and the second transconductance circuit may include the second differential transistor pair of PMOS transistors 338, 342. For another example, referring to FIG. 5, the first transconductance circuit may include the first differential transistor pair of NMOS transistors 460, 462, and the second transconductance circuit may include the second differential transistor pair of PMOS transistors 438, 442. For yet another example, referring to FIG. 6, the first transconductance circuit may include the first differential transistor pair of PMOS transistors 508, 510, and the second transconductance circuit may include the second differential transistor pair of NMOS transistors 534, 536.

The first transconductance circuit may further include a tank circuit coupled in parallel with the first differential transistor pair. The first transconductance circuit may further include a transformer coupled in parallel with the first differential transistor pair. The first differential transistor pair may include a plurality of NMOS transistors and the second differential transistor pair may include a plurality of PMOS transistors. In such a configuration, the VCO may be a CMOS VCO in the first configuration and an NMOS VCO in the second configuration. The first differential transistor pair may include a plurality of PMOS transistors and the second differential transistor pair may include a plurality of NMOS transistors. In such a configuration, the VCO may be a CMOS VCO in the first configuration and a PMOS VCO in the second configuration. For example, referring to FIG. 4, the first transconductance circuit 305 may include a tank circuit 354 coupled in parallel with the first differential transistor pair of NMOS transistors 360, 362. The second differential transistor pair includes PMOS transistors 338, 342. The VCO is a CMOS VCO in the first configuration and an NMOS VCO in the second configuration. For another example, referring to FIG. 5, the first transconductance circuit 405 may include a tank circuit 454 coupled in parallel with the first differential transistor pair of NMOS transistors 460, 462. The second differential transistor pair includes PMOS transistors 438, 442. The VCO is a CMOS VCO in the first configuration and an NMOS VCO in the second configuration. For yet another example, referring to FIG. 6, the first transconductance circuit 505 may include a tank circuit 512 coupled in parallel with the first differential transistor pair of PMOS transistors 508, 510. The second differential transistor pair includes NMOS transistors 534, 536. The VCO is a CMOS VCO in the first configuration and a PMOS VCO in the second configuration.

The first transconductance circuit may include a first cross-coupled transistor circuit and the second transconductance circuit may include a second cross-coupled transistor circuit. For example, referring to FIG. 4, the first differential transistor pair 360, 362 and the second differential transistor pair 338, 342 are both cross coupled, with the drain of a first transistor of the differential transistor pair coupled to the gate of a second transistor of the differential transistor pair, and the drain of the second transistor of the differential transistor pair coupled to the gate of the first transistor of the differential transistor pair. For another example, referring to FIG. 5, the first differential transistor pair 460, 462 and the second differential transistor pair 438, 442 are both cross coupled, with the drain of a first transistor of the differential transistor pair coupled to the gate of a second transistor of the differential transistor pair, and the drain of the second transistor of the differential transistor pair coupled to the gate of the first transistor of the differential transistor pair. For yet another example, referring to FIG. 6, the first differential transistor pair 508, 510 and the second differential transistor pair 534, 536 are both cross coupled, with the drain of a first transistor of the differential transistor pair coupled to the gate of a second transistor of the differential transistor pair, and the drain of the second transistor of the differential transistor pair coupled to the gate of the first transistor of the differential transistor pair. In an alternative configuration, the effect of cross coupling can be obtained by utilizing a transformer in the configuration of the differential transistor pair.

In one configuration, the first cross-coupled transistor circuit includes a first transistor and a second transistor, the second cross-coupled transistor circuit includes a third transistor and a fourth transistor, and the first transistor and the second transistor have an oxide layer thickness greater than an oxide layer thickness of the third transistor and the fourth transistor. For example, referring to FIG. 4, the NMOS transistors 360, 362 may have an oxide layer thickness greater than an oxide layer thickness of the PMOS transistors 338, 342. For another example, referring to FIG. 5, the NMOS transistors 460, 462 may have an oxide layer thickness greater than an oxide layer thickness of the PMOS transistors 438, 442. For yet another example, referring to FIG. 6, the PMOS transistors 508, 510 may have an oxide layer thickness greater than an oxide layer thickness of the NMOS transistors 534, 536.

In one configuration, the second cross-coupled transistor circuit includes a first transistor and a second transistor. The first transistor has a first transistor source, a first transistor gate, and a first transistor drain. The second transistor has a second transistor source, a second transistor gate, and a second transistor drain. The first transistor source and the second transistor source are coupled to a power source. The first transistor drain is coupled to the second transistor gate and to the first transconductance circuit. The second transistor drain is coupled to the first transistor gate and to the first transconductance circuit. The second transconductance circuit further includes a first switch coupled between the first transistor gate and the second transistor drain. The second transconductance circuit further includes a second switch coupled between the second transistor gate and the first transistor drain. The first switch is configured to couple the first transistor gate to the second transistor drain and the first transconductance circuit in the first configuration and to isolate the first transistor gate from the second transistor drain and the first transconductance circuit in the second configuration. The second switch is configured to couple the second transistor gate to the first transistor drain and the second transconductance circuit in the first configuration and to isolate the second transistor gate from the first transistor drain and the second transconductance circuit in the second configuration. For example, referring to FIG. 4, the switch 340 is configured to couple the gate of the PMOS transistor 338 to the drain of the PMOS transistor 342 and the first transconductance circuit 305 in the first configuration, and to isolate the gate of the PMOS transistor 338 from the drain of the PMOS transistor 342 and the first transconductance circuit 305 in the second configuration. Further, the switch 344 is configured to couple the gate of the PMOS transistor 342 to the drain of the PMOS transistor 338 and the first transconductance circuit 305 in the first configuration, and to isolate the gate of the PMOS transistor 342 from the drain of the PMOS transistor 338 and the first transconductance circuit 305 in the second configuration. For another example, referring to FIG. 5, the switch 440 is configured to couple the gate of the PMOS transistor 438 to the drain of the PMOS transistor 442 and the first transconductance circuit 405 in the first configuration, and to isolate the gate of the PMOS transistor 438 from the drain of the PMOS transistor 442 and the first transconductance circuit 405 in the second configuration. Further, the switch 444 is configured to couple the gate of the PMOS transistor 442 to the drain of the PMOS transistor 438 and the first transconductance circuit 405 in the first configuration, and to isolate the gate of the PMOS transistor 442 from the drain of the PMOS transistor 438 and the first transconductance circuit 405 in the second configuration. For yet another example, referring to FIG. 6, the switch 526 is configured to couple the gate of the NMOS transistor 534 to the drain of the NMOS transistor 536 and the first transconductance circuit 505 in the first configuration, and to isolate the gate of the NMOS transistor 534 from the drain of the NMOS transistor 536 and the first transconductance circuit 505 in the second configuration. Further, the switch 528 is configured to couple the gate of the NMOS transistor 536 to the drain of the NMOS transistor 534 and the first transconductance circuit 505 in the first configuration, and to isolate the gate of the NMOS transistor 536 from the drain of the NMOS transistor 534 and the first transconductance circuit 505 in the second configuration.

In one configuration, the second transconductance circuit further includes a third switch coupled between the first transistor gate and a second power source. The third switch is configured to be open in the first configuration and to be closed in the second configuration. The second transconductance circuit further includes a fourth switch coupled between the second transistor gate and a third power source. The fourth switch is configured to be open in the first configuration and to be closed in the second configuration. The second transconductance circuit further includes a fifth switch coupled to the first transistor source, the second transistor source, and a node between the third switch and the fourth switch. The fifth switch is configured to be open in the first configuration and to be closed in the second configuration. The first switch may be a third transistor and the second switch may be a fourth transistor. The third transistor and the fourth transistor may have an oxide layer thickness greater than an oxide layer thickness of the first transistor and the second transistor. For example, referring to FIG. 4, the third switch may be the switch 332, the fourth switch may be the switch 330, and the fifth switch may be the switch 328. The switches 332, 330, 328 are each coupled to the supply voltage $V_R$. For another example, referring to FIG. 5, the third switch may be the switch 432, the fourth switch may be the switch 430, and the fifth switch may be the switch 428. The switches 432, 430, 428 are each coupled to the supply voltage $V_R$.

In one configuration, the third transistor and the fourth transistor may be NMOS transistors. For example, referring to FIG. 4, the transistors 340, 344 are NMOS transistors. For another example, referring to FIG. 5, the transistors 440, 444 are NMOS transistors. For yet another example, referring to FIG. 6, the transistors 526, 528 are NMOS transistors. The third transistor has a third transistor source, a third transistor gate, and a third transistor drain. The fourth transistor has a fourth transistor source, a fourth transistor gate, and a fourth transistor drain. The third transistor drain is coupled to the first transistor gate, the third transistor source is coupled to the second transistor drain, the fourth transistor drain is coupled to the second transistor gate, and the fourth transistor source is coupled to the first transistor drain. The third transistor gate and the fourth transistor gate are coupled together at a node, the node being connected to second power source in the first configuration and to ground in the second configuration. The second transconductance circuit may further include a third switch coupled between the node and the second power source and a fourth switch coupled between the node and ground. The third switch may be configured to be closed in the first configuration and to be open in the second configuration, and the fourth switch may be configured to be open in the first configuration and to be closed in the second configuration.

In one configuration, the third transistor and the fourth transistor may be PMOS transistors. Although not shown in FIGS. 3, 4, 5, as discussed supra, the transistors 340, 344, 440, 444, 526, 528 may be PMOS transistors. The third transistor has a third transistor source, a third transistor gate, and a third transistor drain. The fourth transistor has a fourth transistor source, a fourth transistor gate, and a fourth transistor drain. The third transistor source is coupled to the first transistor gate, the third transistor drain is coupled to the second transistor drain, the fourth transistor source is coupled to the second transistor gate, and the fourth transistor drain is coupled to the first transistor drain. The third transistor gate and the fourth transistor gate are coupled together at a node, the node being connected to ground in the first configuration and to a second power source in the second configuration. The second transconductance circuit may further include a third switch coupled between the node and the second power source and a fourth switch coupled between the node and ground. The third switch may be configured to be open in the first configuration and to be closed in the second configuration, and the fourth switch may be configured to be closed in the first configuration and to be open in the second configuration.

The first transconductance circuit and the second transconductance circuit may include a plurality of at least one of field-effect transistors (FETs) or bipolar junction transistors (BJTs). As such, each of the NMOS and PMOS transistors may be a different type of FET or a BJT other than a metal-oxide-semiconductor field-effect transistor (MOSFET). As discussed supra, the second transconductance circuit may include a number n of parallel subcircuits, n being adjustable for adjusting a frequency of the VCO signal of the VCO. Further, the VCO and/or a processor/controller for configuring the VCO may decrease, in the first configuration, the frequency of the VCO signal of the VCO by increasing the number n of the parallel subcircuits in the second transconductance circuit. Further, the VCO and/or processor/controller for configuring the VCO may increase, in the first configuration, the frequency of the VCO signal of the VCO by decreasing the number n of the parallel subcircuits in the second transconductance circuit. In the second configuration, the VCO and/or processor/controller for configuring the VCO may decrease the number n of the parallel subcircuits in the second transconductance circuit to one.

Referring again to FIG. 2, an apparatus may include the VCO 274 and/or the data processor/controller 210, and/or the VCO 284 and/or the data processor/controller 210. The apparatus may provide a VCO signal in a VCO. The VCO includes a first transconductance circuit and a second transconductance circuit coupled to the first transconductance circuit. The apparatus includes means for coupling an input of the second transconductance circuit to the first transconductance circuit in a first configuration. The apparatus further includes means for isolating the input of the second transconductance circuit from the first transconductance circuit in a second configuration. The apparatus may further include means for decreasing, in the first configuration, the frequency of the VCO signal of the VCO by increasing the number n of the parallel subcircuits in the second transconductance circuit. The apparatus may further includes means for increasing, in the first configuration, the frequency of the VCO signal of the VCO by decreasing the number n of the parallel subcircuits in the second transconductance circuit. The apparatus may further include means for decreasing, in the second configuration, the number n of the parallel subcircuits in the second transconductance circuit to one. The aforementioned means may be one or more of the VCO 274, the VCO 284, the data processor/controller 210, the computer-readable medium 212, and/or the computer-readable medium 216 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for providing a voltage controlled oscillator (VCO) signal, the apparatus being a VCO, comprising:
a first transconductance circuit; and
a second transconductance circuit coupled with the first transconductance circuit, the second transconductance circuit having a first configuration and a second configuration, the second transconductance circuit being configured to couple an input of the second transconductance circuit to the first transconductance circuit in the first configuration, the second transconductance circuit being configured to isolate the input of the second transconductance circuit from the first transconductance circuit in the second configuration;
wherein the second transconductance circuit comprises a number n of parallel subcircuits, n being adjustable for adjusting a frequency of the VCO signal of the VCO.

2. The apparatus of claim 1, wherein the second transconductance circuit comprises a first transistor and a second transistor, and the input comprises a gate of each of the first transistor and the second transistor.

3. The apparatus of claim 1, wherein the first transconductance circuit comprises a first differential transistor pair and the second transconductance circuit comprises a second differential transistor pair.

4. The apparatus of claim 3, wherein the first transconductance circuit further comprises a tank circuit coupled in parallel with the first differential transistor pair.

5. The apparatus of claim 3, wherein the first transconductance circuit further comprises a transformer coupled in parallel with the first differential transistor pair.

6. The apparatus of claim 3, wherein the first differential transistor pair comprises a plurality of n-channel metal-oxide-semiconductor (NMOS) transistors and the second differential transistor pair comprises a plurality of p-channel metal-oxide-semiconductor (PMOS) transistors.

7. The apparatus of claim 6, wherein the VCO is a complementary metal-oxide-semiconductor (CMOS) VCO in the first configuration and the VCO is an NMOS VCO in the second configuration.

8. The apparatus of claim 3, wherein the first differential transistor pair comprises a plurality of p-channel metal-oxide-semiconductor (PMOS) transistors and the second differential transistor pair comprises a plurality of n-channel metal-oxide-semiconductor (NMOS) transistors.

9. The apparatus of claim 8, wherein the VCO is a complementary metal-oxide-semiconductor (CMOS) VCO in the first configuration and the VCO is a PMOS VCO in the second configuration.

10. The apparatus of claim 1, wherein the first transconductance circuit comprises a first cross-coupled transistor circuit and the second transconductance circuit comprises a second cross-coupled transistor circuit.

11. The apparatus of claim 10, wherein the first cross-coupled transistor circuit comprises a first transistor and a second transistor, the second cross-coupled transistor circuit comprises a third transistor and a fourth transistor, and the first transistor and the second transistor have an oxide layer thickness greater than an oxide layer thickness of the third transistor and the fourth transistor.

12. The apparatus of claim 10, wherein the second cross-coupled transistor circuit comprises a first transistor and a second transistor, the first transistor having a first transistor source, a first transistor gate, and a first transistor drain, the second transistor having a second transistor source, a second transistor gate, and a second transistor drain, the first transistor source and the second transistor source being coupled to a power source, the first transistor drain being coupled to the second transistor gate and to the first transconductance circuit, the second transistor drain being coupled to the first transistor gate and to the first transconductance circuit, the second transconductance circuit further comprising a first switch coupled between the first transistor gate and the second transistor drain, the second transconductance circuit further comprising a second switch coupled between the second transistor gate and the first transistor drain, the first switch being configured to couple the first transistor gate to the second transistor drain and the first transconductance circuit in the first configuration and to isolate the first transistor gate from the second transistor drain and the first transconductance circuit in the second configuration, the second switch being configured to couple the second transistor gate to the first transistor drain and the second transconductance circuit in the first configuration and to isolate the second transistor gate from the first transistor drain and the second transconductance circuit in the second configuration.

13. The apparatus of claim 12, wherein the second transconductance circuit further comprises:
a third switch coupled between the first transistor gate and a second power source, the third switch being configured to be open in the first configuration and to be closed in the second configuration;
a fourth switch coupled between the second transistor gate and a third power source, the fourth switch being configured to be open in the first configuration and to be closed in the second configuration; and
a fifth switch coupled to the first transistor source, the second transistor source, and a node between the third switch and the fourth switch, the fifth switch being configured to be open in the first configuration and to be closed in the second configuration.

14. The apparatus of claim 12, wherein the first switch is a third transistor and the second switch is a fourth transistor.

15. The apparatus of claim 14, wherein the third transistor and the fourth transistor are n-channel metal-oxide-semiconductor (NMOS) transistors.

16. The apparatus of claim 15, wherein the third transistor comprises a third transistor source, a third transistor gate, and a third transistor drain, the fourth transistor comprises a fourth transistor source, a fourth transistor gate, and a fourth transistor drain, the third transistor drain being coupled to the first transistor gate, the third transistor source being coupled to the second transistor drain, the fourth transistor drain being coupled to the second transistor gate, the fourth transistor source being coupled to the first transistor drain, the third transistor gate and the fourth transistor gate being coupled together at a node, the node being connected to second power source in the first configuration and to ground in the second configuration.

17. The apparatus of claim 16, wherein the second transconductance circuit further comprises a third switch coupled between the node and the second power source and a fourth switch coupled between the node and ground, wherein the third switch is configured to be closed in the first configuration and to be open in the second configuration, and the fourth switch is configured to be open in the first configuration and to be closed in the second configuration.

18. The apparatus of claim 14, wherein the third transistor and the fourth transistor are p-channel metal-oxide-semiconductor (PMOS) transistors.

19. The apparatus of claim 18, wherein the third transistor comprises a third transistor source, a third transistor gate, and a third transistor drain, the fourth transistor comprises a fourth transistor source, a fourth transistor gate, and a fourth transistor drain, the third transistor source being coupled to the first transistor gate, the third transistor drain being coupled to the second transistor drain, the fourth transistor source being coupled to the second transistor gate, the fourth transistor drain being coupled to the first transistor drain, the third transistor gate and the fourth transistor gate being coupled together at a node, the node being connected to ground in the first configuration and to a second power source in the second configuration.

20. The apparatus of claim 19, wherein the second transconductance circuit further comprises a third switch coupled between the node and the second power source and a fourth switch coupled between the node and ground, wherein the third switch is configured to be open in the first configuration and to be closed in the second configuration, and the fourth switch is configured to be closed in the first configuration and to be open in the second configuration.

21. The apparatus of claim 1, wherein the first transconductance circuit and the second transconductance circuit comprise a plurality of at least one of field-effect transistors (FETs) or bipolar junction transistors (BJTs).

22. A method of providing a voltage controlled oscillator (VCO) signal in a VCO, the VCO comprising a first transconductance circuit and a second transconductance circuit coupled to the first transconductance circuit, the method comprising:
coupling an input of the second transconductance circuit to the first transconductance circuit in a first configuration; and
isolating the input of the second transconductance circuit from the first transconductance circuit in a second configuration:
wherein the second transconductance circuit comprises a number n of parallel subcircuits, n being adjustable for adjusting a frequency of the VCO signal of the VCO.

23. The method of claim 22, wherein the second transconductance circuit comprises a first transistor and a second transistor, and the input comprises a gate of each of the first transistor and the second transistor.

24. The method of claim 22, wherein the first transconductance circuit comprises a first differential transistor pair and the second transconductance circuit comprises a second differential transistor pair.

25. The method of claim 24, wherein the first transconductance circuit further comprises a tank circuit coupled in parallel with the first differential transistor pair.

26. The method of claim 24, wherein the first transconductance circuit further comprises a transformer coupled in parallel with the first differential transistor pair.

27. The method of claim 24, wherein the first differential transistor pair comprises a plurality of n-channel metal-oxide-semiconductor (NMOS) transistors and the second differential transistor pair comprises a plurality of p-channel metal-oxide-semiconductor (PMOS) transistors.

28. The method of claim 27, wherein the VCO is a complementary metal-oxide-semiconductor (CMOS) VCO in the first configuration and the VCO is an NMOS VCO in the second configuration.

29. The method of claim 24, wherein the first differential transistor pair comprises a plurality of p-channel metal-oxide-semiconductor (PMOS) transistors and the second differential transistor pair comprises a plurality of n-channel metal-oxide-semiconductor (NMOS) transistors.

30. The method of claim 29, wherein the VCO is a complementary metal-oxide-semiconductor (CMOS) VCO in the first configuration and the VCO is a PMOS VCO in the second configuration.

31. The method of claim 29, wherein the first transconductance circuit comprises a first cross-coupled transistor circuit and the second transconductance circuit comprises a second cross-coupled transistor circuit.

32. The method of claim 22, wherein the first cross-coupled transistor circuit comprises a first transistor and a second transistor, the second cross-coupled transistor circuit comprises a third transistor and a fourth transistor, and the first transistor and the second transistor have an oxide layer thickness greater than an oxide layer thickness of the third transistor and the fourth transistor.

33. The method of claim 31, wherein the second cross-coupled transistor circuit comprises a first transistor and a second transistor, the first transistor having a first transistor source, a first transistor gate, and a first transistor drain, the second transistor having a second transistor source, a second transistor gate, and a second transistor drain, the first transistor source and the second transistor source being coupled to a power source, the first transistor drain being coupled to the second transistor gate and to the first transconductance circuit, the second transistor drain being coupled to the first transistor gate and to the first transconductance circuit, the second transconductance circuit further comprising a first switch coupled between the first transistor gate and the second transistor drain, the second transconductance circuit further comprising a second switch coupled between the second transistor gate and the first transistor drain, the first switch being configured to couple the first transistor gate to the second transistor drain and the first transconductance circuit in the first configuration and to isolate the first transistor gate from the second transistor drain and the first transconductance circuit in the second configuration, the second switch being configured to couple the second transistor gate to the first transistor drain and the second transconductance circuit in the first configuration and to isolate the second transistor gate from the first transistor drain and the second transconductance circuit in the second configuration.

34. The method of claim 33, wherein the second transconductance circuit further comprises:
a third switch coupled between the first transistor gate and a second power source, the third switch being configured to be open in the first configuration and to be closed in the second configuration;
a fourth switch coupled between the second transistor gate and a third power source, the fourth switch being configured to be open in the first configuration and to be closed in the second configuration; and
a fifth switch coupled to the first transistor source, the second transistor source, and a node between the third switch and the fourth switch, the fifth switch being configured to be open in the first configuration and to be closed in the second configuration.

35. The method of claim 33, wherein the first switch is a third transistor and the second switch is a fourth transistor.

36. The method of claim 35, wherein the third transistor and the fourth transistor are n-channel metal-oxide-semiconductor (NMOS) transistors.

37. The method of claim 36, wherein the third transistor comprises a third transistor source, a third transistor gate, and a third transistor drain, the fourth transistor comprises a fourth transistor source, a fourth transistor gate, and a fourth transistor drain, the third transistor drain being coupled to the first transistor gate, the third transistor source being coupled to the second transistor drain, the fourth transistor drain being coupled to the second transistor gate, the fourth transistor source being coupled to the first transistor drain, the third transistor gate and the fourth transistor gate being coupled together at a node, the node being connected to second power source in the first configuration and to ground in the second configuration.

38. The method of claim 37, wherein the second transconductance circuit further comprises a third switch coupled between the node and the second power source and a fourth switch coupled between the node and ground, wherein the third switch is configured to be closed in the first configuration and to be open in the second configuration, and the fourth switch is configured to be open in the first configuration and to be closed in the second configuration.

39. The method of claim 35, wherein the third transistor and the fourth transistor are p-channel metal-oxide-semiconductor (PMOS) transistors.

40. The method of claim 39, wherein the third transistor comprises a third transistor source, a third transistor gate, and a third transistor drain, the fourth transistor comprises a fourth transistor source, a fourth transistor gate, and a fourth transistor drain, the third transistor source being coupled to the first transistor gate, the third transistor drain being coupled to the second transistor drain, the fourth transistor source being coupled to the second transistor gate, the fourth transistor drain being coupled to the first transistor drain, the third transistor gate and the fourth transistor gate being coupled together at a node, the node being connected to ground in the first configuration and to a second power source in the second configuration.

41. The method of claim 40, wherein the second transconductance circuit further comprises a third switch coupled between the node and the second power source and a fourth switch coupled between the node and ground, wherein the third switch is configured to be open in the first configuration and to be closed in the second configuration, and the fourth switch is configured to be closed in the first configuration and to be open in the second configuration.

42. The method of claim 22, wherein the first transconductance circuit and the second transconductance circuit comprise a plurality of at least one of field-effect transistors (FETs) or bipolar junction transistors (BJTs).

43. The method of claim 22, further comprising decreasing, in the first configuration, the frequency of the VCO signal of the VCO by increasing the number n of the parallel subcircuits in the second transconductance circuit.

44. The method of claim 22, further comprising increasing, in the first configuration, the frequency of the VCO signal of the VCO by decreasing the number n of the parallel subcircuits in the second transconductance circuit.

45. The method of claim 22, further comprising decreasing, in the second configuration, the number n of the parallel subcircuits in the second transconductance circuit to one.

46. Au apparatus for providing a voltage controlled oscillator (VCO) signal in a VCO, the VCO comprising a first transconductance circuit and a second transconductance circuit coupled to the first transconductance circuit, the apparatus comprising:

means for coupling an input of the second transconductance circuit to the first transconductance circuit in a first configuration; and means for isolating the input of the second transconductance circuit from the first transconductance circuit in a second configuration;

wherein the second transconductance circuit comprises a number n of parallel subcircuits, n being adjustable for adjusting a frequency of the VCO signal of the VCO.

47. The apparatus of claim 46, wherein the second transconductance circuit comprises a first transistor and a second transistor, and the input comprises a gate of each of the first transistor and the second transistor.

48. The apparatus of claim 46, wherein the first transconductance circuit comprises a first differential transistor pair and the second transconductance circuit comprises a second differential transistor pair.

49. The apparatus of claim 48, wherein the first transconductance circuit further comprises a tank circuit coupled in parallel with the first differential transistor pair.

50. The apparatus of claim 48, wherein the first transconductance circuit further comprises a transformer coupled in parallel with the first differential transistor pair.

51. The apparatus of claim 48, wherein the first differential transistor pair comprises a plurality of n-channel metal-oxide-semiconductor (NMOS) transistors and the second differential transistor pair comprises a plurality of p-channel metal-oxide-semiconductor (PMOS) transistors.

52. The apparatus of claim 51, wherein the VCO is a complementary metal-oxide-semiconductor (CMOS) VCO in the first configuration and the VCO is an NMOS VCO in the second configuration.

53. The apparatus of claim 48, wherein the first differential transistor pair comprises a plurality of p-channel metal-oxide-semiconductor (PMOS) transistors and the second differential transistor pair comprises a plurality of n-channel metal-oxide-semiconductor (NMOS) transistors.

54. The apparatus of claim 53, wherein the VCO is a complementary metal-oxide-semiconductor (CMOS) VCO in the first configuration and the VCO is a PMOS VCO the second configuration.

55. The apparatus of claim 46, wherein the first transconductance circuit comprises a first cross-coupled transistor circuit and the second transconductance circuit comprises a second cross-coupled transistor circuit.

56. The apparatus of claim 55, wherein the first cross-coupled transistor circuit comprises a first transistor, and a second transistor, the second cross-coupled transistor circuit comprises a third transistor and a fourth transistor, and the first transistor and the second transistor have an oxide layer thickness greater than an oxide layer thickness of the third transistor and the fourth transistor.

57. The apparatus of claim 55, wherein the second cross-coupled transistor circuit comprises a first transistor and a second transistor, the first transistor having a first transistor source, a first transistor gate, and a first transistor drain, the second transistor having a second transistor source, a second transistor gate, and a second transistor drain, the first transistor source and the second transistor source being coupled to a power source, the first transistor drain being coupled to the second transistor gate and to the first transconductance circuit, the second transistor drain being coupled to the first transistor gate and to the first transconductance circuit, the second transconductance circuit further comprising a first switch coupled between the first transistor gate and the second transistor drain, the second transconductance circuit further comprising a second switch coupled between the second transistor gate and the first transistor drain, the first switch being configured to couple the first transistor gate to the second transistor drain and the first transconductance circuit in the first configuration and to isolate the first transistor gate from the second transistor drain and the first transconductance circuit in the second configuration, the second switch being configured to couple the second transistor gate to the first transistor drain and the second transconductance circuit in the first configuration and to isolate the second transistor gate from the first transistor drain and the second transconductance circuit in the second configuration.

58. The apparatus of claim 57, wherein the second transconductance circuit further comprises:
a third switch coupled between the first transistor gate and a second power source, the third switch being configured to be open in the first configuration and to be closed in the second configuration;
a fourth switch coupled between the second transistor gate and a third power source, the fourth switch being configured to be open in the first configuration and to be closed in the second configuration; and
a fifth switch coupled to the first transistor source, the second transistor source, and a node between the third switch and the fourth switch, the fifth switch being configured to be open in the first configuration and to be closed in the second configuration.

59. The apparatus of claim 57, wherein e first switch is a third transistor and the second switch is a fourth transistor.

60. The apparatus of claim 59, wherein the third transistor and the fourth transistor are n-channel metal-oxide-semiconductor (NMOS) transistors.

61. The apparatus of claim 60, wherein the third transistor comprises a third transistor source, a third transistor gate, and a third transistor drain, the fourth transistor comprises a fourth transistor source, a fourth transistor gate, and a fourth transistor drain, the third transistor drain being coupled to the first transistor gate, the third transistor source being coupled to the second transistor drain, the fourth transistor drain being coupled to the second transistor gate, the fourth transistor source being coupled to the first transistor drain, the third transistor gate and the fourth transistor gate being, coupled together at a node, the node being connected to second power source in the first configuration and to ground in the second configuration.

62. The apparatus of claim 61, wherein the second transconductance circuit further comprises a third switch coupled between the node and the second power source and a fourth switch coupled between the node and ground, wherein the third switch is configured to be closed in the first configuration and to be open in the second configuration, and the fourth switch is configured to be open in the first configuration and to be closed in the second configuration.

63. The apparatus of claim 59, wherein the third transistor and the fourth transistor are p-channel metal-oxide-semiconductor (PMOS) transistors.

64. The apparatus of claim 63, wherein the third transistor comprises a third transistor source, a third transistor gate, and a third transistor drain, the fourth transistor comprises a fourth transistor source, a fourth transistor gate, and a fourth transistor drain, the third transistor source being coupled to the first transistor gate, the third transistor drain being coupled to the second transistor drain, the fourth transistor source being coupled to the second transistor gate, the fourth transistor drain being coupled to the first transistor drain, the third transistor gate and the fourth transistor gate being coupled together at a node, the node being connected to ground in the first configuration and to a second power source in the second configuration.

65. The apparatus of claim 64, wherein the second transconductance circuit further comprises a third switch coupled between the node and the second power source and a fourth switch coupled between the node and ground, wherein the third switch is configured to be open in the first configuration and to be closed in the second configuration, and the fourth switch is configured to be closed in the first configuration and to be open in the second configuration.

66. The apparatus of claim 46, wherein the first transconductance circuit and the second transconductance circuit comprise a plurality of at least one of field-effect transistors (FETs) or bipolar junction transistors (BJTs).

67. The apparatus of claim 46, further comprising means for decreasing, in the first configuration, the frequency of the VCO signal of the VCO by increasing the number of the parallel subcircuits in the second transconductance circuit.

68. The apparatus of claim 46, further comprising means for increasing, in the first configuration, the frequency of the VCO signal of the VCO by decreasing the number of the parallel subcircuits in the second transconductance circuit.

69. The apparatus of claim 46, further comprising means for decreasing, in the second configuration, the number n of the parallel subcircuits in the second transconductance circuit to one.

70. An apparatus for providing a voltage controlled oscillator (VCO) signal in a VCO, the VCO comprising a first transconductance circuit and a second transconductance circuit coupled to the first transconductance circuit, the apparatus comprising:
a processor configured to:
couple an input of the second transconductance circuit to the first transconductance circuit in a first configuration; and
isolate the input of the second transconductance circuit from the first transconductance circuit in a second configuration;
wherein the second transconductance circuit comprises a number n of parallel subcircuits, n being adjustable for adjusting a frequency of the VCO signal of the VCO.

71. The apparatus of claim 70, wherein the second transconductance circuit comprises a first transistor and a second transistor, and the input comprises a gate of each of the first transistor and the second transistor.

72. The apparatus of claim 70, wherein the first transconductance circuit comprises a first differential transistor pair and the second transconductance circuit comprises a second differential transistor pair.

73. The apparatus of claim 72, wherein the first transconductance circuit further comprises a tank circuit coupled parallel with the first differential transistor pair.

74. The apparatus of claim 72, wherein the first transconductance circuit further comprises a transformer coupled in parallel with the first differential transistor pair.

75. The apparatus of claim 72, wherein the first differential transistor pair comprises a plurality of n-channel metal-oxide-semiconductor (NMOS) transistors and the second differential transistor pair comprises a plurality of p-channel metal-oxide-semiconductor (PMOS) transistors.

76. The apparatus of claim 75, wherein the VCO is a complementary metal-oxide-semiconductor (CMOS) VCO in the first configuration and the VCO is an NMOS VCO in the second configuration.

77. The apparatus of claim 72, wherein the first differential transistor pair comprises a plurality of p-channel metal-oxide-semiconductor (PMOS) transistors and the second differential transistor pair comprises a plurality of n-channel metal-oxide-semiconductor (NMOS) transistors.

78. The apparatus of claim 77, wherein the VCO is a complementary metal-oxide-semiconductor (CMOS) VCO in the first configuration and the VCO is a PMOS VCO in the second configuration.

79. The apparatus of claim 70, wherein the first transconductance circuit comprises a first cross-coupled transistor circuit and the second transconductance circuit comprises a second cross-coupled transistor circuit.

80. The apparatus of claim 79, wherein the first cross-coupled transistor circuit comprises a first transistor and a second transistor, the second cross-coupled transistor circuit comprises a third transistor and a fourth transistor, and the first transistor and the second transistor have an oxide layer thickness greater than an oxide layer thickness of the third transistor and the fourth transistor.

81. The apparatus of claim 79, wherein the second cross-coupled transistor circuit comprises first transistor and a second transistor, the first transistor having a first transistor source, a first transistor gate, and a first transistor drain, the second transistor having a second transistor source, a second transistor gate, and a second transistor drain, the first transistor source and the second transistor source being coupled to a power source, the first transistor drain being coupled to the second transistor gate and to the first transconductance circuit, the second transistor drain being coupled to the first transistor gate and to the first transconductance circuit, the second transconductance circuit further comprising a first switch coupled between the first transistor gate and the second transistor drain, the second transconductance circuit further comprising a second switch coupled between the second transistor gate and the first transistor drain, the first switch being configured to couple the first transistor gate to the second transistor drain and the first transconductance circuit in the first configuration and to isolate the first transistor gate from the second transistor drain and the first transconductance circuit in the second configuration, the second switch being configured to couple the second transistor gate to the first transistor drain and the second transconductance circuit in the first configuration and to isolate the second transistor gate from the first transistor drain and the second transconductance circuit in the second configuration.

82. The apparatus of claim 81, wherein the second transconductance circuit further comprises:
a third switch coupled between the first transistor gate and a second power source, the third switch being configured to be open in the first configuration and to be closed in the second configuration;
a fourth switch coupled between the second transistor gate and a third power source, the fourth switch being configured to be open in the first configuration and to be closed in the second configuration; and
a fifth switch coupled to the first transistor source, the second transistor source, and a node between the third switch and the fourth switch, the fifth switch being configured to be open in the first configuration and to be closed in the second configuration.

83. The apparatus of claim 81, wherein the first switch is a third transistor and the second switch is a fourth transistor.

84. The apparatus of claim 83, wherein the third transistor and the fourth transistor are n-channel metal-oxide-semiconductor (NMOS) transistors.

85. The apparatus of claim 84, wherein the third transistor comprises a third transistor source, a third transistor gate, and a third transistor drain, the fourth transistor comprises a fourth transistor source, a fourth transistor gate, and a fourth transistor drain, the third transistor drain being coupled to the first transistor gate, the third transistor source being coupled to the second transistor drain, the fourth transistor drain being coupled to the second transistor gate, the fourth transistor source being coupled to the first transistor drain, the third transistor gate and the fourth transistor gate being coupled together at a node, the node being connected to second power source in the first configuration and to ground in the second configuration.

86. The apparatus of claim 85, wherein the second transconductance circuit further comprises a third switch coupled between the node and the second power source and a fourth switch coupled between the node and ground, wherein the third switch is configured to be closed in the first configuration and to be open in the second configuration, and the fourth switch is configured to be open in the first configuration and to be closed in the second configuration.

87. The apparatus of claim 83, wherein the third transistor and the fourth transistor are p-channel metal-oxide-semiconductor (PMOS) transistors.

88. The apparatus of claim 87, wherein the third transistor comprises a third transistor source, a third transistor gate, and a third transistor drain, the fourth transistor comprises a fourth transistor source, a fourth transistor gate, and a fourth transistor drain, the third transistor source being coupled to the first transistor gate, the third transistor drain being coupled to the second transistor drain, the fourth transistor source being coupled to the second transistor gate, the fourth transistor drain being coupled to the first transistor drain, the third transistor gate and the fourth transistor gate being coupled together at a node, the node being connected to ground in the first configuration and to a second power source in the second configuration.

89. The apparatus of claim 88, wherein the second transconductance circuit further comprises a third switch coupled between the node and the second power source and a fourth switch coupled between the node and ground, wherein the third switch is configured to be open in the first configuration and to be closed in the second configuration, and the fourth switch is configured to be closed in the first configuration and to be open in the second configuration.

90. The apparatus of claim 70, wherein the first transconductance circuit and the second transconductance circuit comprise a plurality of at least one of field-effect transistors (FETs) or bipolar junction transistors (BJTs).

91. The apparatus of claim 70, wherein the processor is further configured to decrease, in the first configuration, the frequency of the VCO signal of the VCO by increasing the number n of the parallel subcircuits in the second transconductance circuit.

92. The apparatus of claim 70, wherein the processor is further configured to increase, in the first configuration, the frequency of the VCO signal of the VCO by decreasing the number n of the parallel subcircuits in the second transconductance circuit.

93. The apparatus of claim 70, wherein the processor is further configured to decrease, in the second configuration, the number n of the parallel subcircuits in the second transconductance circuit to one.

94. A computer program product for providing a voltage controlled oscillator (VCO) signal in a VCO, the VCO comprising a first transconductance circuit and a second transconductance circuit coupled to the first transconductance circuit, the computer program product comprising:

a computer-readable medium comprising code for:

coupling an input of the second transconductance circuit to the first transconductance circuit in a first configuration; and isolating the input of the second transconductance circuit from the first transconductance circuit in a second configuration;

wherein the second transconductance circuit comprises a number n of parallel subcircuits, n being adjustable for adjusting a frequency of the VCO signal of the VCO.

* * * * *